United States Patent
Higashi

(10) Patent No.: US 10,465,299 B2
(45) Date of Patent: Nov. 5, 2019

(54) GAS PRODUCTION APPARATUS

(71) Applicants: FUJIFILM Corporation, Tokyo (JP); Japan Technological Research Association of Articifial Photosynthetic Chemical Process, Tokyo (JP)

(72) Inventor: Kohei Higashi, Ashigara-kami-gun (JP)

(73) Assignees: FUJIFILM Corporation, Tokyo (JP); JAPAN TECHNOLOGICAL RESEARCH ASSOCIATION OF ARTIFICIAL PHOTOSYNTHETIC CHEMICAL PROCESS, Tokyo (JP)

( * ) Notice: Subject to any disclaimer, the term of this patent is extended or adjusted under 35 U.S.C. 154(b) by 819 days.

(21) Appl. No.: 14/865,334

(22) Filed: Sep. 25, 2015

(65) Prior Publication Data
US 2016/0010218 A1 Jan. 14, 2016

Related U.S. Application Data

(63) Continuation of application No. PCT/JP2014/057581, filed on Mar. 19, 2014.

(30) Foreign Application Priority Data

Mar. 28, 2013 (JP) .................................. 2013-068939

(51) Int. Cl.
*C25B 1/02* (2006.01)
*C25B 1/00* (2006.01)
*C25B 11/04* (2006.01)
*H01L 31/05* (2014.01)
*H01L 31/0749* (2012.01)
(Continued)

(52) U.S. Cl.
CPC ................ *C25B 1/003* (2013.01); *C25B 1/10* (2013.01); *C25B 11/04* (2013.01); *H01L 31/046* (2014.12);
(Continued)

(58) Field of Classification Search
CPC .............. C25B 1/003; C25B 1/04; C25B 1/02
(Continued)

(56) References Cited

FOREIGN PATENT DOCUMENTS

JP 2003-288955 A 10/2003
JP 2004-197167 A 7/2004
(Continued)

OTHER PUBLICATIONS

Australian Office Action, dated Jun. 30, 2016, for Australian Application No. 2014246141.
(Continued)

*Primary Examiner* — Zulmariam Mendez
(74) *Attorney, Agent, or Firm* — Birch, Stewart, Kolasch & Birch, LLP

(57) ABSTRACT

A gas production apparatus is provided which includes: a module including a plurality of PN junctions connected in series to one another, each being formed of an inorganic semiconductor and having a light receiving surface; two gas generators that are provided at open ends of PN junctions at both extremities of the module, respectively, on a side of the light receiving surface; an electrolysis chamber which contains an aqueous electrolytic solution in contact with the two gas generators and contains gases generated by the two gas generators; and a diaphragm which is ion-permeable but gas-impermeable, and partitions the electrolysis chamber into two regions including the two gas generators, respectively, and containing hydrogen and oxygen, respectively.

18 Claims, 10 Drawing Sheets

(51) Int. Cl.
    *H01L 31/046*     (2014.01)
    *C25B 1/10*     (2006.01)
    *H01L 31/072*     (2012.01)

(52) U.S. Cl.
    CPC ...... *H01L 31/0504* (2013.01); *H01L 31/0512* (2013.01); *H01L 31/0516* (2013.01); *H01L 31/072* (2013.01); *H01L 31/0749* (2013.01); *Y02E 10/541* (2013.01); *Y02E 60/366* (2013.01); *Y02P 20/134* (2015.11); *Y02P 70/521* (2015.11)

(58) Field of Classification Search
    USPC .......................................................... 204/248
    See application file for complete search history.

(56) References Cited

FOREIGN PATENT DOCUMENTS

| | | |
|---|---|---|
| JP | 2005-133174 A | 5/2005 |
| JP | 2012-107280 A | 6/2012 |
| JP | 2012-177160 A | 9/2012 |
| JP | 2012-204275 A | 10/2012 |
| JP | 2012-204276 A | 10/2012 |

OTHER PUBLICATIONS

International Search Report, issued in PCT/JP2014/057581, dated Jun. 17, 2014.

Yokoyama et al., "$H_2$ Evolution from Water on Modified $Cu_2ZnSnS_4$ Photoelectrode under Solar Light", Applied Physics Express, 2010, vol. 3, No. 10, The Japan Society of Applied Physics, pp. 101202-1 to 101202-3.

Australian Office Action, dated Mar. 17, 2016, for Australian Application No. 2014246141 is provided.

International Preliminary Report on Patentability and the English translation of the Written Opinion of the International Searching Authority (Forms PCT/IB/338, PCT/IB/373 and PCT/ISA/237), dated Oct. 8, 2015, for International Application No. PCT/JP2014/057581.

Japanese Office Action for Japanese Application No. 2013-068939, dated May 31, 2016, with an English translation.

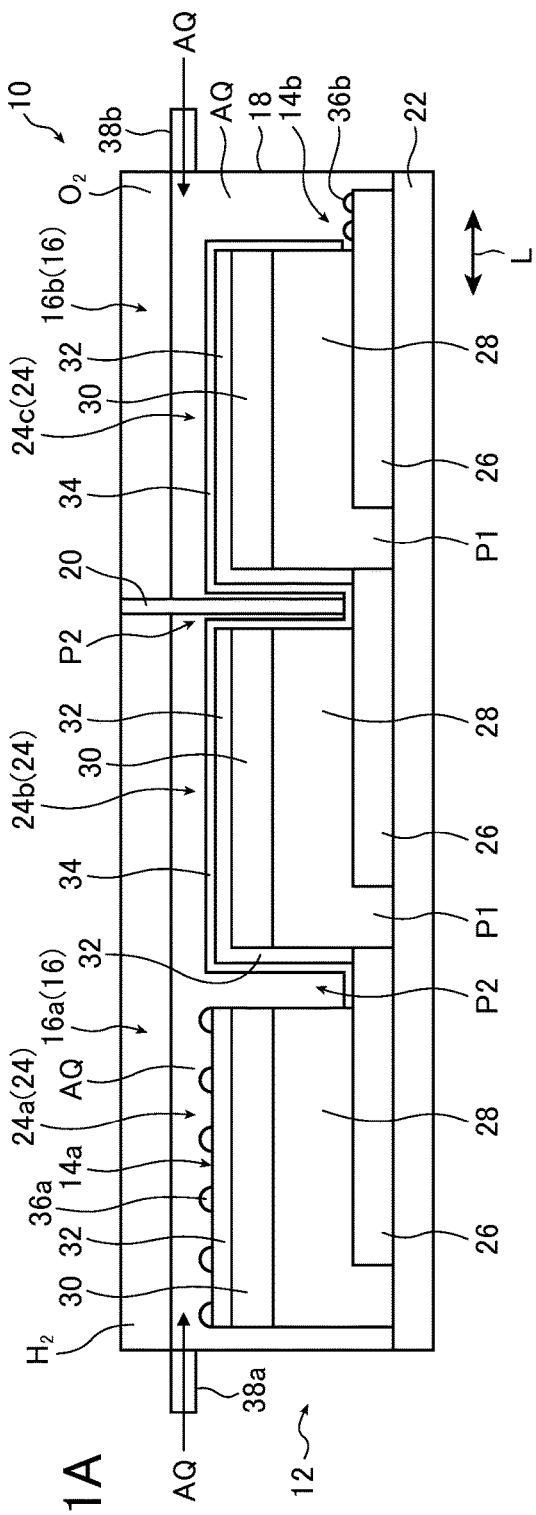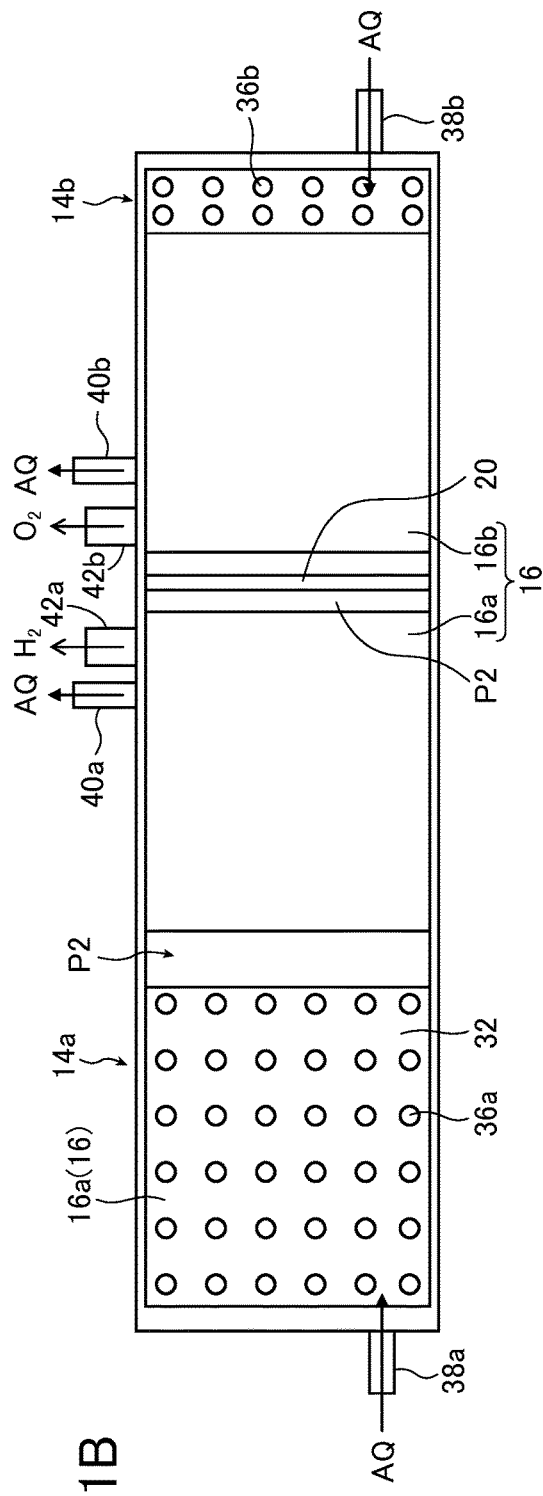

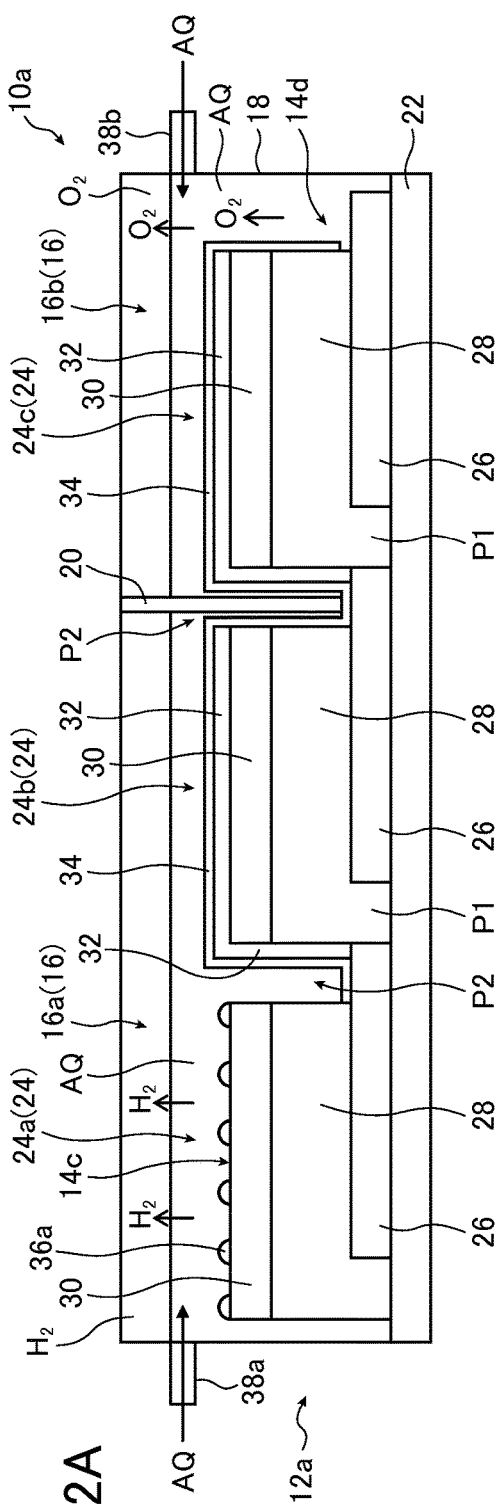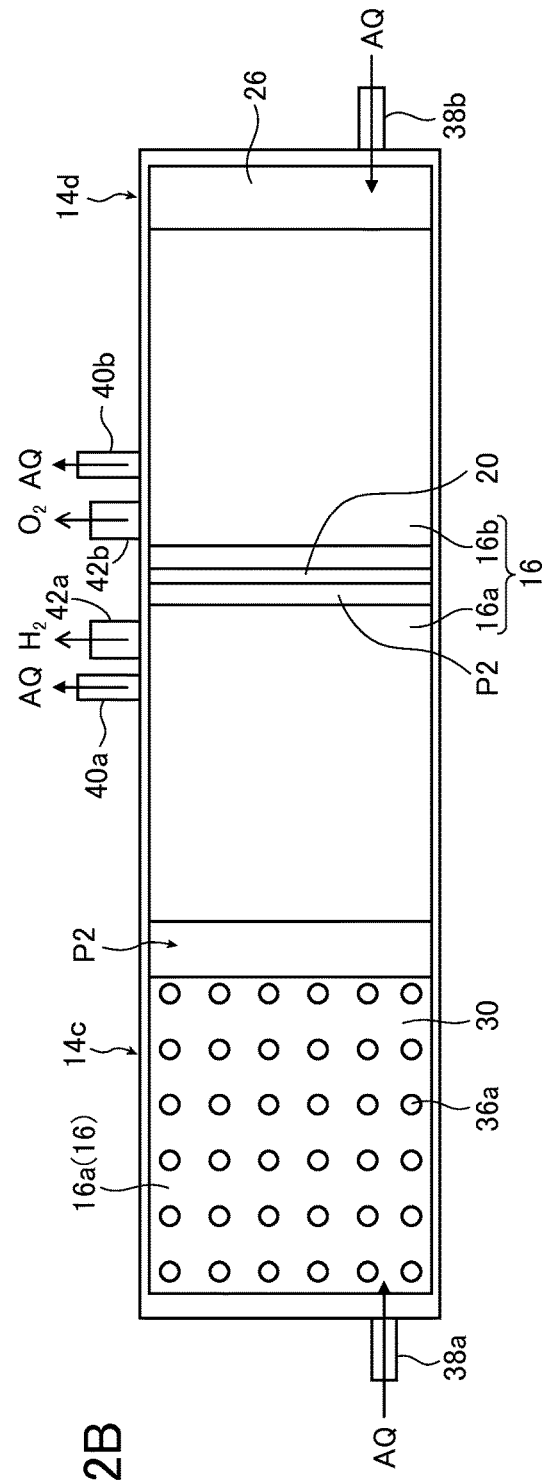

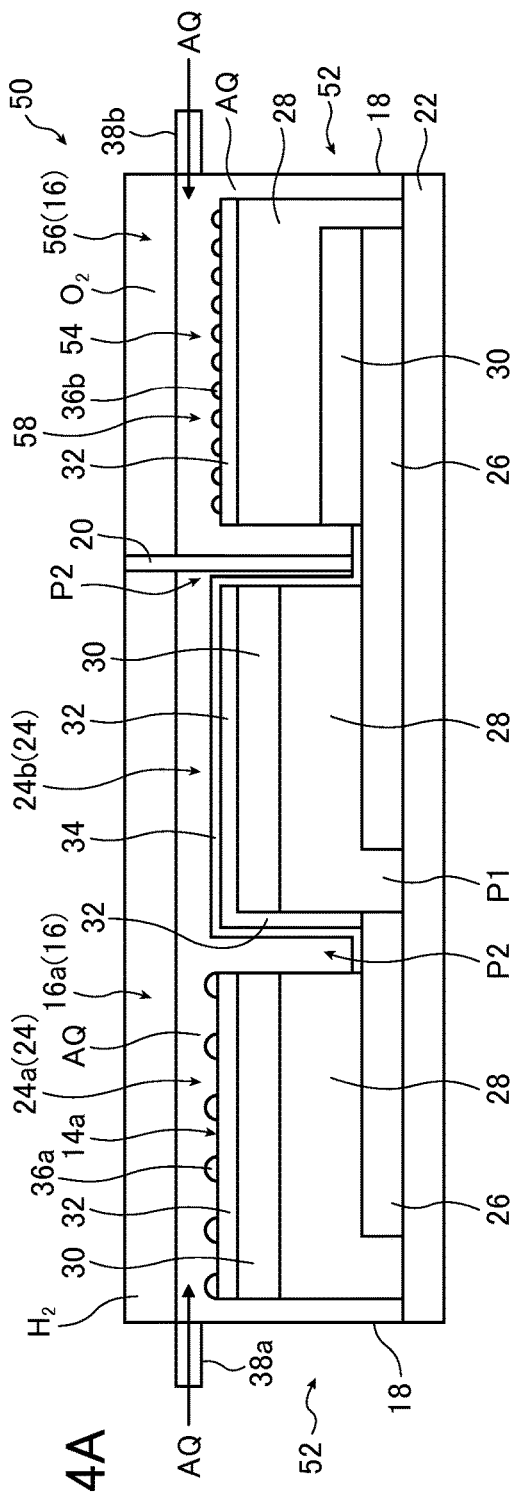
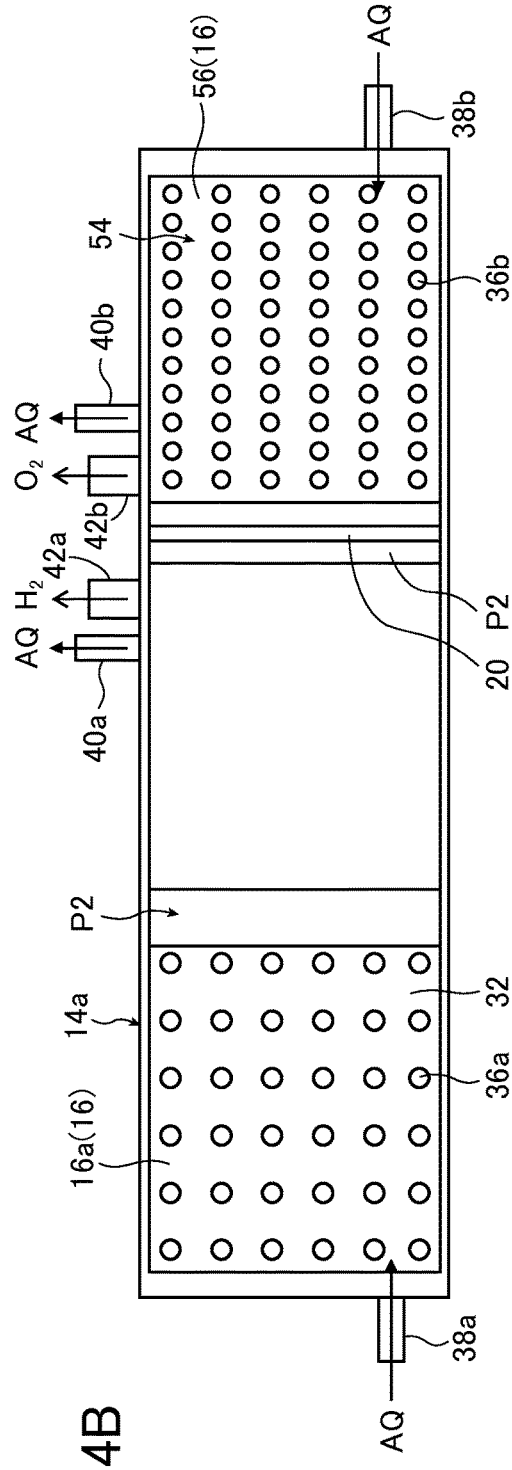
FIG.4A
FIG.4B

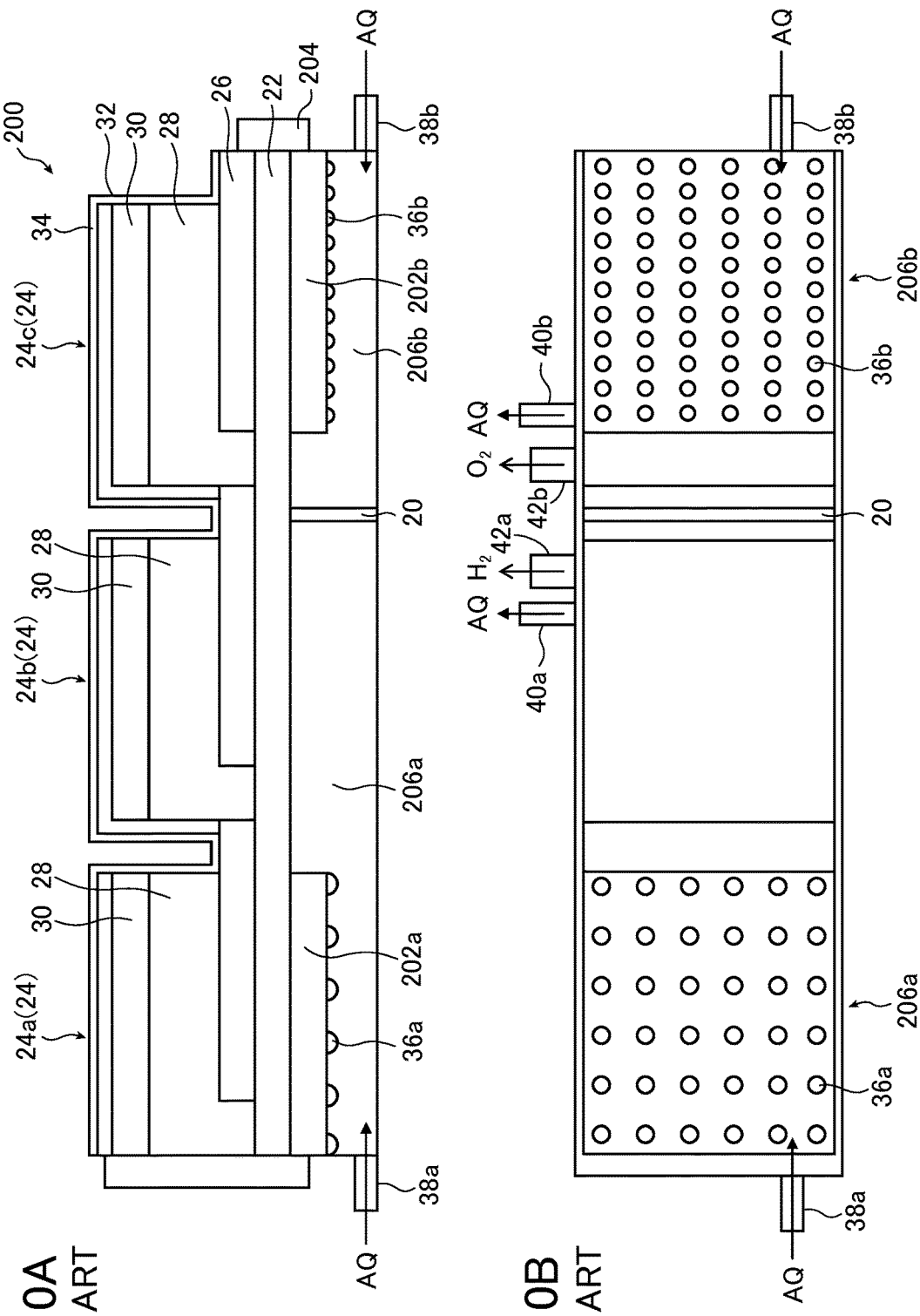

GAS PRODUCTION APPARATUS

CROSS-REFERENCE TO RELATED APPLICATIONS

This application is a continuation of PCT International Application No. PCT/JP2014/057581 filed on Mar. 19, 2014, which claims priority under 35 U.S.C. § 119(a) to Japanese Patent Application No. 2013-068939 filed on Mar. 28, 2013. Each of the above applications is hereby expressly incorporated by reference, in its entirety, into the present application.

BACKGROUND OF THE INVENTION

The present invention relates to a gas production apparatus. Specifically, the present invention relates to a gas production apparatus that produces hydrogen and oxygen by decomposing water by receiving light.

In the prior art, as one of the modes of using solar light energy as a renewable energy, hydrogen production apparatuses have been suggested which produce hydrogen used for fuel cells and the like by using a photoelectric conversion material used for solar cells and utilizing electrons and holes obtained by photoelectric conversion for a decomposition reaction of water (for example, see JP 2012-177160 A and JP 2004-197167 A).

In both of the hydrogen production apparatuses disclosed in JP 2012-177160 A and JP 2004-197167 A, a photoelectric conversion portion or a solar cell, in which two or more PN junctions generating an electromotive force when solar light is incident thereon are connected to each other in series, is provided; an electrolytic solution chamber is disposed at the lower side of the photoelectric conversion portion or the solar cell that is opposite to a light receiving surface which receives solar light on the upper side of the photoelectric conversion portion or the solar cell; and the inside of an electrolysis chamber is divided by an ion-conductive partition or diaphragm, and the documents disclose that by the electric power that is generated in the photoelectric conversion portion or the solar cell by the received solar light, water is electrolyzed, and hydrogen is generated.

According to JP 2012-177160 A, because the hydrogen production apparatus can also adjust the orientation of the light receiving surface with respect to the solar light, the amount of incident light that will be subjected to photoelectric conversion can be increased, and hydrogen generation efficiency is not reduced.

Furthermore, according to JP 2004-197167 A, because the hydrogen production apparatus electrolyzes water by using electrode plates, which are connected to a p-type semiconductor and an n-type semiconductor of the solar cell, as a positive electrode and a negative electrode respectively, the efficiency of conversion of solar energy into hydrogen can be improved.

SUMMARY OF THE INVENTION

In both of the hydrogen production apparatuses disclosed in JP 2012-177160 A and JP 2004-197167 A, in the electrolysis chamber that is on the side opposite to the light receiving surface of the photoelectric conversion portion or the solar cell, that is, in the electrolysis chamber that is on the back surface side of the photoelectric conversion portion or the solar cell, hydrogen and oxygen are generated as a result of electrolysis of water. Therefore, if the generated gas such as hydrogen or oxygen adheres to a gas generation surface of the gas generating electrode of the photoelectric conversion portion or the electrode plate of the solar cell and stays between the gas generation surface and an aqueous solution such as an electrolytic solution, a contact area between the gas generation surface and the aqueous solution is reduced, and this leads to a problem in that the efficiency of generating gas such as hydrogen and oxygen is reduced.

Although the hydrogen production apparatuses disclosed in JP 2012-177160 A and JP 2004-197167 A show high gas generation efficiency particularly at the initial gas generation stage, with the passage of time, the amount of gas staying between the gas generation surface and the aqueous solution such as an electrolytic solution increases. As a result, because a contact area between the gas generation surface and the aqueous solution is reduced, the efficiency of generating gas such as hydrogen and oxygen greatly decreases, and this leads to a problem in that gas cannot be stably generated.

An object of the present invention is to solve the aforementioned problems of the prior art and to provide a gas production apparatus which can maintain high gas generation efficiency at the initial gas generation stage and even after the passage of time, and can stably produces hydrogen gas and oxygen gas as high-purity gases completely separated from each other.

In order to achieve the above object, the present invention provides a gas production apparatus comprising: a PN junction module including a plurality of PN junctions connected in series to one another, each being formed of an inorganic semiconductor and having a light receiving surface on one side and a back surface on another side; two gas generators that are provided at an open end of a PN junction at one extremity of the PN junction module and an open end of a PN junction at another extremity of the PN junction module, respectively, on a side of the PN junction module where the light receiving surface is located; an electrolysis chamber adapted to contain an aqueous electrolytic solution in contact with the two gas generators and contain gases generated by the two gas generators; and a diaphragm which is ion-permeable but gas-impermeable, and partitions the electrolysis chamber into two regions including the two gas generators, respectively, wherein: the PN junction module is connected in series by connecting the back surface of a PN junction to the light receiving surface of an adjacent PN junction by a conductive material; and the two regions into which the electrolysis chamber is partitioned by the diaphragm are a region in which hydrogen generated by one of the two gas generators in contact with the aqueous electrolytic solution is contained and a region which contains oxygen generated by another of the two gas generators in contact with the aqueous electrolytic solution, with the hydrogen and the oxygen being generated when light is made incident on the light receiving surface in the PN junction module.

The gas production apparatus preferably further comprises a light transmitting insulating material which covers a surface of the conductive material in the PN junction module except for the two gas generators.

Preferably, the inorganic semiconductor includes a CIGS compound semiconductor or a CZTS compound semiconductor, and has an absorption wavelength edge equal to or greater than 800 nm.

It is preferable that N-side surfaces of the plurality of PN junctions each constitute the light receiving surface; P-side surfaces of the plurality of PN junctions each constitute the back surface; and the gas production apparatus further comprises back surface electrodes provided on the P-side surfaces of the plurality of PN junctions.

It is preferable that an N-side surface of the PN junction at the one extremity of the PN junction module serves as one of the two gas generators that generates hydrogen; and the gas production apparatus further comprises light transmitting conductive films made of a light transmitting conductive material that cover the N-side surfaces of the plurality of PN junctions of the PN junction module except for the PN junction at the one extremity, respectively.

Alternatively, it is preferable that the gas production apparatus further comprises light transmitting conductive films made of a light transmitting conductive material that cover the N-side surfaces of the plurality of PN junctions; and a light transmitting conductive film which covers an N-side surface of the PN junction at the one extremity of the PN junction module serves as one of the two gas generators that generates hydrogen.

Alternatively, it is preferable that the gas production apparatus further comprises light transmitting conductive films made of a light transmitting conductive material that cover the N-side surfaces of the plurality of PN junctions; one of the two gas generators that generates hydrogen is electrically connected to a light transmitting conductive film which covers an N-side surface of the PN junction at the one extremity of the PN junction module; and the diaphragm is provided between one of the two gas generators that generates hydrogen and the PN junction at the one extremity.

It is preferable that a back surface electrode provided on a P-side surface of the PN junction at the other extremity of the PN junction module partially serves as another of the two gas generators that generates oxygen.

Alternatively, it is preferable that the gas production apparatus further comprises an inverse PN junction with reversed order of junction that is positioned on an extended portion of a back surface electrode provided on a P-side surface of the PN junction at the other extremity of the PN junction module; a P-side surface of the inverse PN junction constitutes the light receiving surface; an N-side surface of the inverse PN junction is brought into contact with the extended portion of the back surface electrode; the P-side surface of the inverse PN junction serves as another of the two gas generators that generates oxygen; the gas production apparatus further comprises a light transmitting conductive film made of a light transmitting conductive material that covers the P-side surface of the inverse PN junction as the light receiving surface; and the light transmitting conductive film which covers the P-side surface of the inverse PN junction serves as another of the two gas generators that generates oxygen.

Alternatively, it is preferable that an extended portion of a back surface electrode provided on a P-side surface of the PN junction at the other extremity of the PN junction module serves as another of the two gas generators that generates oxygen; and the diaphragm is provided between another of the two gas generators that generates oxygen and the PN junction at the other extremity of the PN junction module.

It is preferable that the gas production apparatus further comprises a promoter positioned on a surface (gas generation surface thereof) of at least one of the two gas generators; the promoter positioned on the surface of one of the two gas generators that generates hydrogen is platinum as a hydrogen generation catalyst; and the promoter positioned on the surface of another of the two gas generators that generates oxygen is metal, $CoO_x$ or $IrO_2$ as an oxygen generation catalyst.

Preferably, the plurality of PN junctions are equal to one another in amount of electric current generated by light irradiation, and in light receiving area of the light receiving surface.

According to the present invention, it is possible to maintain high gas generation efficiency at the initial gas generation stage and even after the passage of time and to stably produce hydrogen gas and oxygen gas as high-purity gases completely separated from each other.

BRIEF DESCRIPTION OF THE DRAWINGS

FIGS. 1A and 1B are a cross-sectional view and a top view respectively that schematically show an example of a gas production apparatus according to an embodiment of the present invention.

FIGS. 2A and 2B are a cross-sectional view and a top view respectively that schematically show another example of the gas production apparatus according to the above embodiment of the present invention.

FIGS. 3A and 3B are a cross-sectional view and a top view respectively that schematically show another example of the gas production apparatus according to the above embodiment of the present invention.

FIGS. 4A and 4B are a cross-sectional view and a top view respectively that schematically show an example of a gas production apparatus according to another embodiment of the present invention.

FIGS. 10A and 10B are a cross-sectional view and a bottom view respectively that schematically show another gas production apparatus of the prior art.

DETAILED DESCRIPTION OF THE INVENTION

Figure 5:
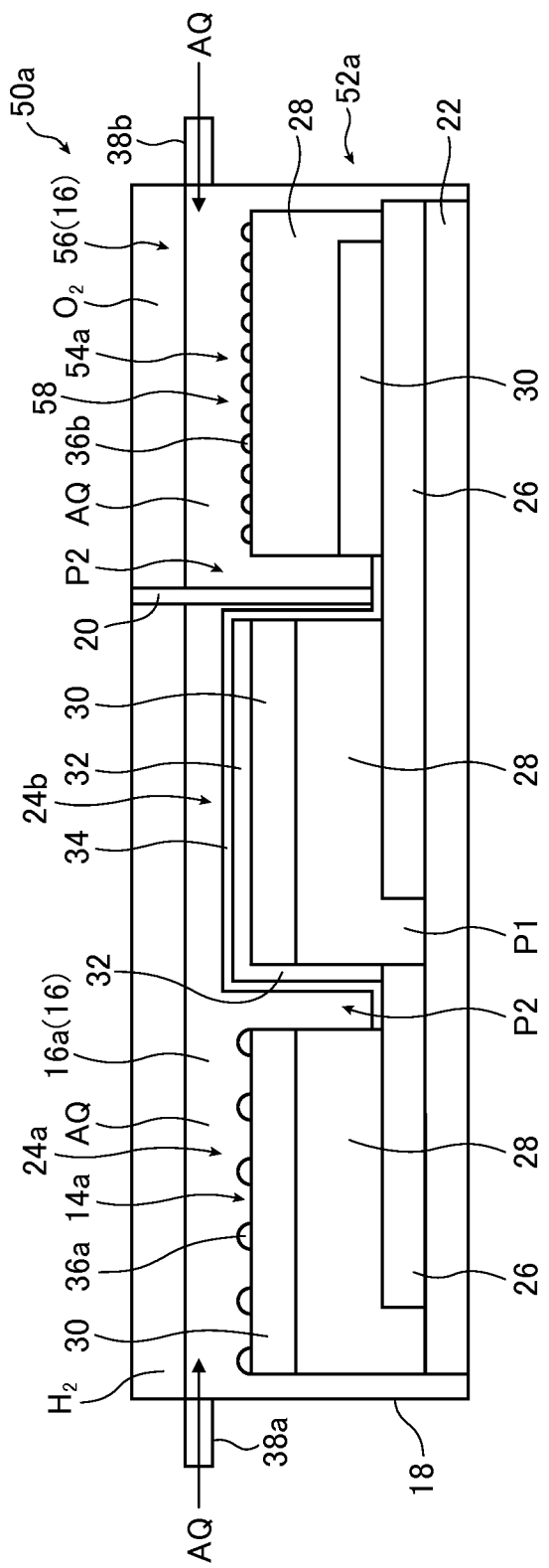
FIG. 5 is a cross-sectional view schematically showing another example of the gas production apparatus according to another embodiment of the present invention.

Hereinafter, the gas production apparatus according to the present invention will be specifically described based on preferred embodiments shown in the attached drawings.

The present invention is an apparatus in which: a plurality of PN junctions constituted with an inorganic semiconductor are outwardly arranged such that each of light receiving surfaces of the junctions is able to absorb light; the PN junctions are connected to each other in series; gas generation surfaces, which are on non-connected sides of the PN junctions at both ends of the series connection, are each brought into contact with an aqueous solution; and light is caused to be incident on the light receiving surfaces such that hydrogen and oxygen are generated from different gas generation surfaces in two different regions on the side of the light receiving surfaces. In the apparatus, those two regions are separated from each other by a diaphragm which is permeable to ions but impermeable to gas, and the conductive material surface outside the hydrogen and oxygen generation regions is preferably covered with a light transmitting insulating material, so as to produce hydrogen and oxygen by a photolysis reaction of water.

First, characteristics of the gas production apparatus according to the invention will be described in comparison with the gas production apparatus of the prior art.

As described above, in the prior art, the surface (gas generation surface) of the electrode for electrolysis that generates gas is disposed on the back surface side of the photoelectric conversion portion that is opposite to the light receiving surface receiving solar light. In contrast, the present invention is characterized in that the gas generation surface and the light receiving surface receiving solar light are disposed on the same side. In this way, if the gas generation surface is disposed on the side of the light receiving surface, desired effects, such as being able to maintain high gas generation efficiency regardless of the passage of time and being able to stably produce hydrogen gas and oxygen gas, are obtained.

FIGS. 1A and 1B are a cross-sectional view and a top view respectively that schematically show an example of a gas production apparatus according to a first embodiment of the present invention.

First, as shown in FIGS. 1A and 1B, a gas production apparatus 10 has a PN junction module 12 in which a plurality of PN junctions composed of an inorganic semiconductor are electrically connected to each other in series, gas generation portions 14a and 14b disposed at open ends of the PN junctions at both ends of the PN junction module 12, respectively, a container 18 constituting an electrolysis chamber 16 which contains an aqueous electrolytic solution AQ in contact with the two gas generation portions 14a and 14b, and hydrogen gas and oxygen gas that are generated in the gas generation portions 14a and 14b, respectively, and a diaphragm 20 which partitions the electrolysis chamber 16 into two electrolysis chambers 16a and 16b including the gas generation portions 14a and 14b, respectively.

The PN junction module 12 is used for generating hydrogen and oxygen through a photolysis reaction of water by receiving light such as solar light through the light receiving surfaces. The PN junction module 12 is an integrated structure having a support substrate 22 which has insulating properties, and a plurality (three in the example shown in the drawings) of PN junction cells 24 (24a, 24b, and 24c) which are provided on the support substrate 22 and connected to each other in series in a longitudinal direction of the support substrate 22.

In the PN junction module 12, the three PN junction cells 24 (24a, 24b, and 24c) are connected to each other in series along a longitudinal direction L of the support substrate 22. Hereinafter, the number of the PN junction cells 24 connected to each other in series is described as three as a typical example. However, as long as the total electromotive force of the PN junction cells 24 is equal to or greater than the starting voltage of the electrolysis of water, the number of the PN junction cells 24 is not limited to three as in the drawings, and it goes without saying that the number of the PN junction cells 24 may be arbitrarily set.

The support substrate 22 is not particularly limited as long as it has insulating properties and strength which enables the support substrate 22 to support the three PN junction cells 24 connected to each other in series. For example, as the support substrate 22, a soda lime glass (SLG) substrate or a ceramic substrate can be used. Furthermore, as the support substrate 22, it is possible to use a material in which an insulating layer is formed on a metal substrate. As the metal substrate, it is possible to use a metal substrate such as an Al (aluminum) substrate or a SUS (stainless steel) substrate or to use a composite metal substrate such as a composite Al substrate formed of a composite material composed of Al and other metals such as SUS. The composite metal substrate is also a sort of metal substrate, and the metal substrate and the composite metal substrate are also simply collectively called a metal substrate. As the support substrate 22, it is also possible to use a metal substrate with an insulating film that has an insulating layer formed by anodizing the surface of an Al substrate or the like. The support substrate 22 may or may not be flexible. In addition to the aforementioned substrates, as the support substrate 22, glass plates such as high strain point glass, alkali-free glass, and the like or a polyimide material can also be used.

The thickness of the support substrate 22 is not particularly limited as long as the support substrate 22 can support the PN junction cells 24 constituting the PN junction module 12. The thickness of the support substrate 22 can be arbitrarily set and, for example, may be about 20 μm to 20,000 μm. The thickness of the support substrate 22 is preferably 100 μm to 10,000 μm, and more preferably 1,000 μm to 5,000 μm.

When PN junction cells containing a CIGS-based compound semiconductor are used as the PN junction cells 24, if there is a portion, which supplies alkali ions (for example, sodium (Na) ions: $Na^+$), on the side of the support substrate 22, the photoelectric conversion efficiency of the PN junction cells 24 is improved. Therefore, it is preferable to dispose an alkali supply layer, which supplies alkali ions, on the upper surface of the support substrate 22. In a case in which a SLG substrate is used, for instance, the alkali supply layer is unnecessary.

The PN junction cells 24 are photoelectric conversion elements having a laminated structure constituted in the same manner as a solar battery cell used as a solar cell. The PN junction cells 24 are used for receiving light such as solar light through the light receiving surface, generating electrons and holes through photoelectric conversion, and sending the generated electrons and holes to the gas generation portions 14a and 14b, respectively.

Each of the PN junction cells 24b and 24c has a constitution in which a back surface electrode 26, a photoelectric conversion layer 28, a buffer layer 30, a transparent electrode 32, and a transparent insulating film 34 are laminated on each other in this order from the side of the support substrate 22. In the leftmost PN junction cell 24a, a promoter 36a for generating hydrogen that is in the form of scattered islands is formed on the transparent electrode 32 functioning as the gas generation portion 14a generating hydrogen. In the rightmost PN junction cell 24c, a promoter 36b for generating oxygen that is in the form of scattered islands is formed on a portion extending from the back surface electrode 26 and functioning as the gas generation portion 14b.

The PN junction cells 24, that is, all of the back surface electrodes 26, the photoelectric conversion layers 28, the buffer layers 30, the transparent electrodes 32 and the transparent insulating film 34, as well as the promoters 36a and 36b are elongated in a width direction (direction perpendicular to the plane of paper) orthogonal to the longitudinal direction L of the support substrate 22.

In the PN junction module 12, light is incident on each of the PN junction cells 24 from the side of the transparent electrode 32 and then passes through the transparent electrode 32 and the buffer layer 30. As a result, an electromotive force occurs in the photoelectric conversion layer 28, and for example, the migration of a charge (electron) to the transparent electrode 32 from the back surface electrode 26 occurs. In other words, an electric current (migration of a hole) flowing to the back surface electrode 26 from the transparent electrode 32 is generated. Accordingly, in the PN junction module 12, the transparent electrode 32 of the leftmost PN junction cell 24a becomes the gas generation portion 14a (negative electrode for electrolysis) generating hydrogen, and the back surface electrode 26 of the rightmost PN junction cell 24c becomes the gas generation portion 14b (positive electrode for electrolysis) generating oxygen.

In the PN junction module 12, the gases generated by the gas generation portions 14a and 14b (polarities of the portions) are changed appropriately according to the constitution of the PN junction cells 24, the constitution of the PN junction module 12, and the like.

The back surface electrode 26 is composed of, for example, Mo. By a plurality of separation grooves P1 disposed in the longitudinal direction L of the support substrate 22 at a predetermined interval, the back surface electrode 26 is separated from another back surface electrode 26 adjacent thereto.

The photoelectric conversion layer 28 is composed of, for example, a CIGS-based compound semiconductor film or a CZTS-based compound semiconductor film, and is formed on the back surface electrode 26 while filling the separation groove P1.

The buffer layer 30 is composed of, for example, a thin film of CdS or the like and is formed on the surface of the photoelectric conversion layer 28. At the interface between the photoelectric conversion layer 28 and the buffer layer 30, PN junction is formed.

An open groove P2 reaching the surface of the back surface electrode 26 through the buffer layer 30 and the photoelectric conversion layer 28 is formed in a position different from the position in which the separation groove P1 is formed, in the longitudinal direction L.

The transparent electrode 32 is composed of, for example, a transparent conductive film such as a ZnO:Al film and is formed on the buffer layer 30. In each of the midmost PN junction cell 24b and the rightmost PN junction cell 24c, the transparent electrode 32 is also formed on a side wall of the open groove P2 between the PN junction cells 24a and 24b or between the PN junction cells 24b and 24c (the side wall of the open groove P2 on the PN junction cell 24b or 24c side, that is to say, the lateral face of the PN junction cell 24b or 24c on the left side in the drawing) so that the open groove P2 may partially be filled with the transparent electrode.

In this way, the transparent electrode 32 functions as the light receiving surface on the PN junction composed of the buffer layer 30 and the photoelectric conversion layer 28, and also functions as a conductive film directly connecting the back surface electrode 26 of the PN junction cell 24a to the PN junction cell 24b and a conductive film directly connecting the back surface electrode 26 of the PN junction cell 24b to the PN junction cell 24c.

The transparent insulating film 34 is so formed as to cover the top of the entire transparent electrodes 32 and the lateral faces with no transparent electrode 32 formed thereon (lateral faces each on the right side in the drawing) of the PN junction cells 24b and 24c, as well as the portions of the back surface electrodes 26 of the PN junction cells 24a and 24b that constitute the bottoms of two open grooves P2, respectively. In other words, the transparent insulating film 34 is so formed as to cover the entire conductive portion of the PN junction module 12, except for the entire outer surface of the PN junction cell 24a constituting the gas generation portion 14a (the entire outer surface of the transparent electrode 32, the buffer layer 30 and the photoelectric conversion layer 28 except for the back surface electrode 26) and the portion extending from the back surface electrode 26 of the PN junction cell 24c and constituting the gas generation portion 14b.

The back surface electrode 26 is constituted with, for example, a metal such as Mo, Cr or W, or a combination of these. The back surface electrode 26 may have a single layer structure or a laminated structure such as a double layer structure. It is particularly preferable that the back surface electrode 26 is constituted with Mo. While the film thickness of the back surface electrode 26 is about 800 nm in general, it is preferably 400 nm to 1,000 nm (1 µm).

The portion extending from the back surface electrode 26 of the PN junction cell 24c becomes the gas generation portion 14b (positive electrode for electrolysis) generating oxygen, and generates oxygen molecules, that is, oxygen (oxygen gas) by withdrawing electrons from hydroxide ions $OH^-$ ionized from water molecules ($2OH^- \rightarrow H_2O + O_2/2 + 2e^-$), and the surface thereof functions as the gas generation surface.

At the interface between the buffer layer 30 and the photoelectric conversion layer 28, the photoelectric conversion layer 28 forms the PN junction of which the photoelectric conversion layer 28 side is of a P-type and the buffer layer 30 side is of an N-type. The photoelectric conversion layer 28 absorbs the light reaching it after passing through the transparent insulating film 34, the transparent electrode 32 and the buffer layer 30, generates holes on the P-side and electrons on the N-side, and has a function of photoelectric conversion. In the photoelectric conversion layer 28, the holes generated in the PN junction are migrated toward the back surface electrode 26 from the photoelectric conversion layer 28, and the electrons generated in the PN junction are migrated toward the transparent electrode 32 from the buffer layer 30. The film thickness of the photoelectric conversion layer 28 is preferably 1.0 µm to 3.0 µm, and particularly preferably 1.5 µm to 2.0 µm.

The photoelectric conversion layer 28 is preferably constituted with, for example, a CIGS-based compound semiconductor having a chalcopyrite crystal structure or a CZTS-based compound semiconductor. That is, the photoelectric conversion layer 28 is preferably constituted with a CIGS layer. The CIGS layer may be constituted not only with $Cu(In, Ga)Se_2$ but also with a known material used in the CIGS-based material such as $CuInSe_2$ (CIS).

As the method for forming the CIGS layer, 1) a multisource vapor deposition method, 2) a selenization method, 3) a sputtering method, 4) a hybrid sputtering method, and 5) a mechanochemical processing method are known.

Examples of other methods for forming the CIGS layer include a screen printing method, a close-spaced sublimation method, an MOCVD method, a spraying method (wet film formation method), and the like. For example, by a screen printing method (wet film formation method), a spraying method (wet film formation method) or the like, a fine particle film containing elements of group Ib, group IIIb, and group VIb is formed on a substrate and subjected to thermal decomposition processing (optionally performed in a group VIb element atmosphere), and in this way, a crystal having a desired composition can be obtained (JP 9-74065 A, JP 9-74213 A, and the like).

As described above, in the present invention, the photoelectric conversion layer 28 is preferably constituted with a CIGS-based compound semiconductor having a chalcopyrite crystal structure or a CZTS-based compound semiconductor, for example. However, the present invention is not limited thereto, and any photoelectric conversion element may be used as long as it makes it possible to form a PN junction composed of an inorganic semiconductor and generate hydrogen and oxygen by causing a photolysis reaction of water. For example, a photoelectric conversion element utilized in a solar battery cell constituting a solar battery is preferably used. Examples of such a photoelectric conversion element include a thin film silicon-based thin film-type photoelectric conversion element, a CdTe-based thin film-type photoelectric conversion element, a dye-sensitized thin film-type photoelectric conversion element, and an organic thin film-type photoelectric conversion element, in addition to a CIGS-based thin film-type photoelectric conversion element, a CIS-based thin film-type photoelectric conversion element, and a CZTS-based thin film-type photoelectric conversion element.

The absorption wavelength of the inorganic semiconductor forming the photoelectric conversion layer 28 is not particularly limited as long as the absorption wavelength is within a wavelength range allowing photoelectric conversion. The wavelength range may be any range including wavelength regions of solar light and the like, particularly, from a visible wavelength region to an infrared wavelength region. The absorption wavelength edge of the inorganic semiconductor is preferably equal to or greater than 800 nm, that is to say, a wavelength range including up to an infrared wavelength region is preferred. This is because the solar light energy can be used as much as possible. On the other hand, as the absorption wavelength edge is longer, a band gap decreases. Presumably, this leads to the reduction in the electromotive force for assisting water splitting, and as a result, the number of PN junctions that should be connected to each other in series for water splitting will increase. Therefore, a longer absorption edge is not necessarily better.

The buffer layer 30 is so formed as to constitute a PN junction layer together with the photoelectric conversion layer 28, that is, to form a PN junction at the interface between the photoelectric conversion layer 28 and the buffer layer 30, to protect the photoelectric conversion layer 28 at the time of forming the transparent electrode 32, and to transmit the light incident on the transparent electrode 32 to the photoelectric conversion layer 28.

The buffer layer 30 preferably contains a metal sulfide containing at least one metal element selected from the group consisting of Cd, Zn, Sn and In, with specific examples including CdS, ZnS, Zn(S, O) and/or Zn(S, O, OH), SnS, Sn(S, O) and/or Sn(S, O, OH), InS, In(S, O) and/or In(S, O, OH). The film thickness of the buffer layer 30 is preferably 10 nm to 2 µm, and more preferably 15 nm to 200 nm. The buffer layer 30 is formed by, for example, a chemical bath deposition process (hereafter referred to as "CBD process").

A window layer may be disposed between the buffer layer 30 and the transparent electrode 32. The window layer is constituted with, for example, a ZnO layer having a thickness of about 10 nm.

The transparent electrode 32 has light transmitting properties, brings light into the photoelectric conversion layer 28, and functions as an electrode that is paired with the back surface electrode 26 and moves the holes and electrons generated in the photoelectric conversion layer 28 (to causes an electric current to flow). Furthermore, the transparent electrode 32 functions as a transparent conductive film for directly connecting the PN junction cells 24a and 24b to each other and a transparent conductive film for directly connecting the PN junction cells 24b and 24c to each other so that the three PN junction cells 24a, 24b, and 24c may be connected to each other in series.

The transparent electrode 32 of the leftmost PN junction cell 24a becomes the gas generation portion 14a (negative electrode for electrolysis) generating hydrogen, and generates hydrogen molecules, that is, hydrogen (hydrogen gas) by supplying electrons to hydrogen ions (protons) $H^+$ ionized from water molecules ($2H^+ + 2e^- \rightarrow H_2$), and the surface thereof functions as the gas generation surface.

The transparent electrode 32 is constituted with ZnO doped with Al, B, Ga, In or the like, or ITO (indium tin oxide), for example. The transparent electrode 32 may have a single layer structure or a laminated structure such as a double layer structure. The thickness of the transparent electrode is not particularly limited, but is preferably 0.3 µm to 1 µm.

The method for forming the transparent electrode is not particularly limited. The transparent electrode can be formed by a vapor phase film formation method such as an electron beam vapor deposition method, a sputtering method and a CVD method or by a coating method.

The transparent conductive films, which are for connecting the adjacent PN junction cells 24a and 24b to each other in series and for connecting the adjacent PN junction cells 24b and 24c to each other in series, are not limited to the transparent electrode 32. In view of ease of production, however, it is preferable that the same transparent conductive film as the transparent electrode 32 is formed simultaneously with the latter.

To be more specific: After the buffer layer 30 is laminated on the photoelectric conversion layer 28, the open grooves P2 reaching the surfaces of the back surface electrodes 26 are formed by laser scribing or mechanical scribing, and a transparent conductive film which should constitute the transparent electrodes 32 is formed on the buffer layer 30, and in the open grooves P2 as well so that the grooves may be filled with the film formed. Thereafter, by means of scribing, a portion on the left side in the drawing of the transparent conductive film in each of the open grooves P2 is removed, so that an open groove P2 reaching the surface of the back surface electrode 26 that is slightly reduced in size is newly formed and a conductive film directly connecting the back surface electrode 26 of a PN junction cell 24 to the transparent electrode 32 of an adjacent PN junction cell 24 is left. In this way, the conductive films for connecting the adjacent PN junction cells 24 to each other in series can be formed.

The transparent insulating film 34 has light transmitting properties and is so provided as to cover the portion outside the gas generation regions such that the portion outside the gas generation regions is protected. The portion outside the gas generation regions refers to the conductive material surface of the PN junction cells 24 that is outside the regions of the gas generation portion 14a generating hydrogen and the gas generation portion 14b generating oxygen. That is, the portion includes the transparent electrodes 32, the buffer layers 30, the photoelectric conversion layers 28, and the back surface electrodes 26. Specifically, the portion outside the gas generation regions refers to the top of the entire transparent electrodes 32 and the lateral faces with no transparent electrode 32 formed thereon (lateral faces each on the right side in the drawing) of the PN junction cells 24b and 24c, as well as the portions of the back surface electrodes 26 of the PN junction cells 24a and 24b that constitute the bottoms of two open grooves P2, respectively.

The transparent insulating film 34 is constituted with, for example, an insulating epoxy resin or an insulating silicone resin. The thickness of the transparent insulating film 34 is not particularly limited, but is preferably 2 μm to 100 μm.

The method for forming the transparent insulating film 34 is not particularly limited, and the transparent insulating film 34 can be formed by a coating method, a sputtering method, or the like.

When the PN junction cells 24 are immersed in an aqueous electrolytic solution, the transparent insulating film 34 needs to be provided. However, when the PN junction cells 24 are not immersed in an aqueous electrolytic solution, the transparent insulating film 34 may not be provided.

As described above, the region of the leftmost PN junction cell 24a functions as the gas generation portion 14a generating hydrogen and constitutes a hydrogen gas generation region. The transparent electrode 32 of the PN junction cell 24a functions as the electrode for generating hydrogen, and the surface of the transparent electrode 32 functions as the gas generation surface.

On the surface of the above transparent electrode 32, the hydrogen generation promoter 36a for generating hydrogen that is in the form of scattered islands is formed.

The hydrogen generation promoter 36a is constituted with, for example, Pt (platinum), $NiO_x$ (nickel oxide), $RuO_2$ (ruthenium oxide), or the like. The size of the hydrogen generation promoter 36a is not particularly limited, but is preferably 0.005 μm to 1 μm.

The method for forming the hydrogen generation promoter 36a is not particularly limited, and the hydrogen generation promoter 36a can be formed by a photodeposition method, an impregnation method, a sputtering method, a vapor deposition method, or the like.

As described above, the region of the portion extending from the back surface electrode 26 of the rightmost PN junction cell 24c functions as the gas generation portion 14b generating oxygen and constitutes an oxygen gas generation region. The portion extending from the back surface electrode 26 of the PN junction cell 24c functions as the electrode for generating oxygen, and the surface of the portion extending from the back surface electrode 26 of the PN junction cell 24c functions as the gas generation surface.

On the surface of the portion extending from the back surface electrode 26 of the PN junction cell 24c, the oxygen generation promoter 36b for generating oxygen that is in the form of scattered islands is formed.

The oxygen generation promoter 36b is constituted with, for example, $IrO_2$, $CoO_x$, or the like. The size of the oxygen generation promoter 36b is not particularly limited, but is preferably 0.005 μm to 1 μm.

The method for forming the oxygen generation promoter 36b is not particularly limited, and the oxygen generation promoter 36b can be formed by a dipping method, an impregnation method, a sputtering method, a vapor deposition method, or the like.

The PN junction module 12 can be manufactured by the following manufacturing method, but the manufacturing method is not limited thereto.

First, for example, a soda lime glass to be used as the support substrate 22 is prepared.

Thereafter, for example, a Mo film which should constitute the back surface electrodes 26 is formed on the surface of the support substrate 22 by using a film formation apparatus by means of a sputtering method.

Then, for example, laser scribing is performed on the Mo film in predetermined positions so as to form the separation grooves P1 that extend in the width direction of the support substrate 22. In this way, the back surface electrodes 26 separated from each other by the separation grooves P1 are formed.

Subsequently, for example, a CIGS film (P-type semiconductor layer) is formed as the photoelectric conversion layer 28 such that the back surface electrodes 26 are covered and the separation grooves P1 are filled. The CIGS film is formed by any of the film formation methods described above.

Thereafter, for example, a CdS layer (N-type semiconductor layer) is formed as the buffer layer 30 on the photoelectric conversion layer 28 by a CBD (chemical bath deposition) process.

Then, the two open grooves P2, which extend in the width direction of the support substrate 22 and extend through the buffer layer 30 and the photoelectric conversion layer 28 to the surfaces of the back surface electrodes 26, are formed in the positions in the longitudinal direction L as shown that are different from those where the separation grooves P1 are formed. In this case, as the scribing method, laser scribing or mechanical scribing can be used.

Thereafter, for example, a ZnO:Al layer having Al, B, Ga, Sb or the like added thereto that should constitute the transparent electrodes 32 is formed by a sputtering method or a coating method so that the film may extend in the width direction of the support substrate 22 and cover the buffer layer 30, and the open grooves P2 may be filled with the film.

Subsequently, the ZnO:Al layer in the open grooves P2 is partially removed so that portions thereof, each on the right side in the drawing, may be left, so as to newly form two open grooves P2 reaching the surfaces of the back surface electrodes 26 that are slightly reduced in size. Also in this case, as the scribing method, laser scribing or mechanical scribing can be used. In this way, the three PN junction cells 24 (24a, 24b, and 24c) are formed.

Then, on the outer surface of the PN junction cells 24b and 24c that will not become a gas generation region and on the surfaces of the back surface electrodes 26 at the bottoms of the two open grooves P2, for example, an insulating epoxy resin film as the transparent insulating film 34 is formed by a coating method.

After that, on the transparent electrode 32 of the PN junction cell 24a that is not covered with the insulating epoxy resin film, for example, a Pt promoter serving as a hydrogen generation promoter is supported by a photodeposition method.

Subsequently, on the back surface electrode 26 of the PN junction cell 24c that is not covered with the insulating epoxy resin film either, for example, an $IrO_2$ promoter serving as an oxygen generation promoter is supported by a dipping method.

The PN junction module 12 can be manufactured in this way.

The PN junction module 12 of the gas production apparatus 10 shown in FIG. 1 is constituted as above, but the present invention is not limited thereto.

As in a gas generation portion 14c of a PN junction module 12a of a gas production apparatus 10a shown in FIG. 2, the transparent electrode 32 may not be formed in the leftmost PN junction cell 24a, and the hydrogen generation promoter 36a in the form of scattered islands may be directly formed on the buffer layer 30. In this case, the region (of the buffer layer 30 and the photoelectric conversion layer 28) of the leftmost PN junction cell 24a not having a transparent electrode functions as the gas generation portion 14c generating hydrogen and constitutes a hydrogen gas generation region. The buffer layer 30 of the PN junction cell 24a functions as the electrode for generating hydrogen, and the surface of the buffer layer 30 functions as the gas generation surface. Herein, considering the hydrogen gas generation efficiency and the oxygen gas generation efficiency, it is preferable to form the hydrogen generation promoter 36a on the transparent electrode 32 or the buffer layer 30. However, in the present invention, because a plurality of PN junction cells 24 can be connected to each other in series, the total electromotive force of the PN junction cells 24 can be much higher than the starting voltage of the electrolysis of water. In this case, the hydrogen generation promoter 36a may not be formed on the transparent electrode 32 or the buffer layer 30.

Figures 3A, 3B:
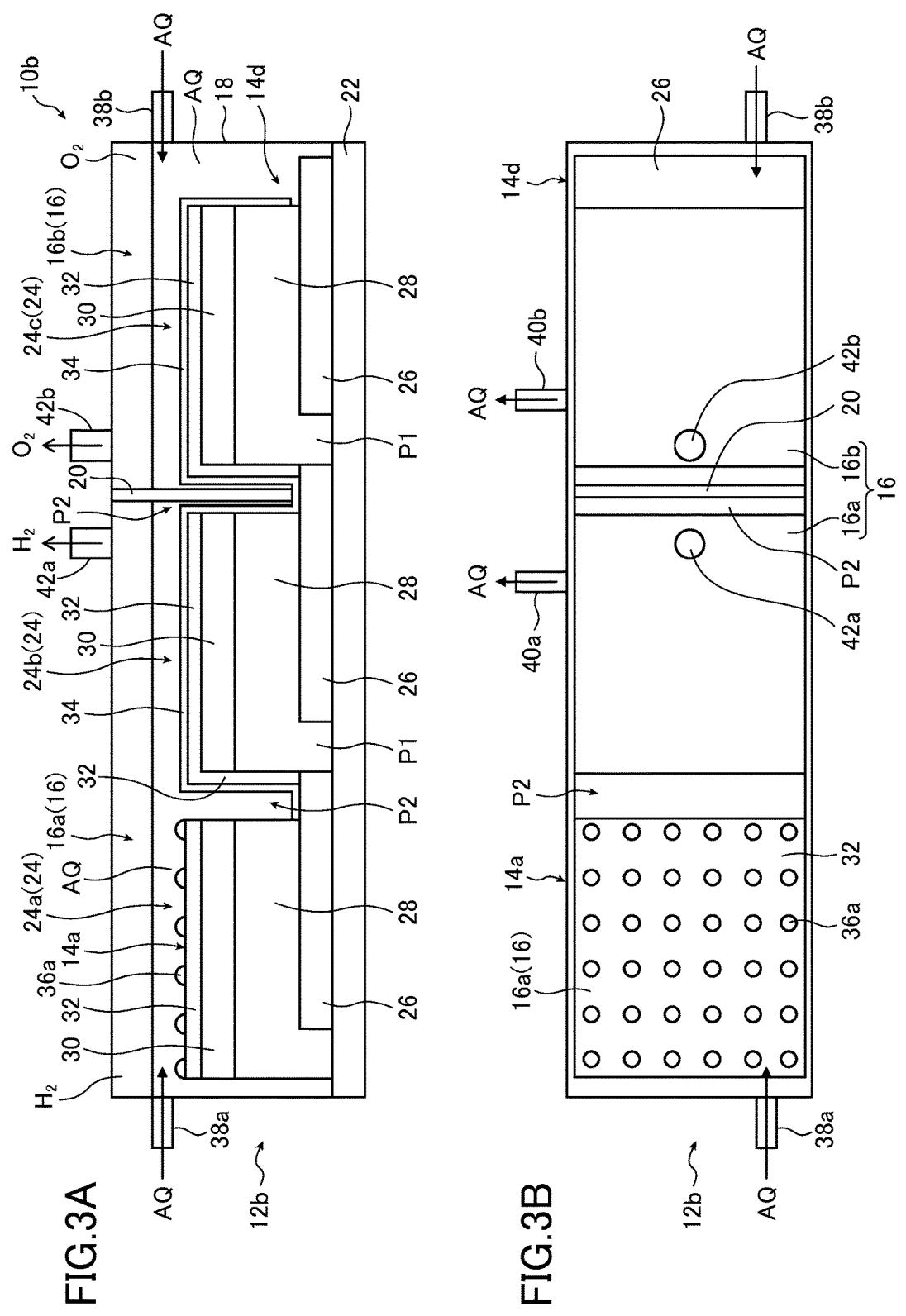

Furthermore, as in a gas generation portion 14d of the PN junction module 12a of the gas production apparatus 10a shown in FIG. 2 and of a PN junction module 12b of a gas production apparatus 10b shown in FIG. 3, the oxygen generation promoter 36b may not be formed on the surface of the portion extending from the back surface electrode 26 of the rightmost PN junction cell 24c, and a smooth surface of the back surface electrode 26 may be used as the gas generation surface.

The PN junction module 12b of the gas production apparatus 10b shown in FIG. 3 includes the gas generation portion 14a, as in the example shown in FIG. 1.

The container 18 houses the PN junction module 12 and constitutes the electrolysis chamber 16 composed of the electrolysis chamber 16a, which contains (retains) the aqueous electrolytic solution AQ in contact with the upper surface of the transparent electrode 32 or the buffer layer 30 of the leftmost PN junction cell 24a that constitutes the gas generation portion 14a or 14c, and contains (retains) hydrogen that is the gas generated from the gas generation portion 14a or 14c, and the electrolysis chamber 16b, which contains (retains) the aqueous electrolytic solution AQ in contact with the upper surface of the portion extending from the back surface electrode 26 of the rightmost PN junction cell 24c that constitutes the gas generation portion 14b or 14d, and contains (retains) oxygen that is the gas generated from the gas generation portion 14b or 14d.

A supply port 38a for supplying the aqueous electrolytic solution AQ into the electrolysis chamber 16a is provided in a front part of a lateral face on the left side in FIG. 1B of the electrolysis chamber 16a in the container 18 (or, provided on the front, left side of the apparatus). Furthermore, a discharge port 40a for discharging the aqueous electrolytic solution AQ in the electrolysis chamber 16a and a collection port 42a for collecting the hydrogen generated in the electrolysis chamber 16a are both provided on a lateral face on the upper (back) side in FIG. 1B of the electrolysis chamber 16a in the container 18 (or, provided on the back side of the apparatus).

A supply portion 38b for supplying the aqueous electrolytic solution AQ into the electrolysis chamber 16b is provided in a front part of a lateral face on the right side in FIG. 1B of the electrolysis chamber 16b in the container 18 (or, provided on the front, right side of the apparatus). Furthermore, a discharge port 40b for discharging the aqueous electrolytic solution AQ in the electrolysis chamber 16b and a collection port 42b for collecting the oxygen generated in the electrolysis chamber 16b are both provided on a lateral face on the upper (back) side in FIG. 1B of the electrolysis chamber 16b in the container 18 (or, provided on the back side of the apparatus).

The supply port 38a and the discharge port 40a are provided in a position slightly above the position of the transparent electrode 32 or the buffer layer 30, such that a water flow, which prevents the hydrogen generated by the transparent electrode 32 or the buffer layer 30 of the PN junction cell 24a from staying on the surface of the transparent electrode 32 or the buffer layer 30, can be generated in the electrolysis chamber 16a. Therefore, it is possible to bring the surface of the transparent electrode 32 or the buffer layer 30 into contact with the aqueous electrolytic solution AQ at all times, and to generate hydrogen with excellent efficiency. It goes without saying that the position of the supply port 38a and the discharge port 40a is the same as the position of the surface of the aqueous electrolytic solution AQ in the electrolysis chamber 16a.

The supply port 38b and the discharge port 40b are provided in a position that is completely or approximately the same as the position of the supply port 38a and the discharge port 40a, such that the position of the surface of the aqueous electrolytic solution AQ in the electrolysis chamber 16b becomes completely or approximately the same as the position of the surface of the aqueous electrolytic solution AQ in the electrolysis chamber 16a.

The hydrogen and oxygen are retained in the electrolysis chambers 16a and 16b, respectively, above the surface of the aqueous electrolytic solution AQ. Accordingly, in order to collect the retained hydrogen and oxygen with excellent efficiency, the collection ports 42a and 42b are provided in a position slightly above the surface of the aqueous electrolytic solution AQ, that is, in a position slightly above the position of the supply port 38a and the discharge port 40a.

In the example shown in FIG. 1, both the collection port 42a collecting hydrogen and the collection port 42b collecting oxygen are provided on a lateral face of the container 18 on the back side (or, provided on the back side of the apparatus), but the present invention is not limited thereto.

As is the case with the gas production apparatus 10b shown in FIG. 3, the collection port 42a collecting hydrogen and the collection port 42b collecting oxygen may be disposed on the upper side in FIG. 3A, that is, on the ceiling of the apparatus, as shown in FIGS. 3A and 3B. If the collection ports 42a and 42b are disposed in this way, light hydrogen and oxygen can be collected with excellent efficiency.

In order that the hydrogen generated in the electrolysis chamber 16a and the oxygen generated in the electrolysis chamber 16b may be separately collected at high purity, and that the hydroxide ions increased due to the generation of hydrogen in the electrolysis chamber 16a (with increased pH) and the hydrogen ions increased due to the generation of oxygen in the electrolysis chamber 16b (with reduced pH) may permeate the diaphragm 20 to cause neutralization, the diaphragm 20 separates the electrolysis chamber 16 in the container 18 into the electrolysis chamber 16a and the electrolysis chamber 16b. The diaphragm 20 is a membrane permeable to ions but impermeable to gas.

The diaphragm 20 is attached to the open groove P2 between the PN junction cells 24b and 24c, in a state of coming into close contact with the transparent insulating film 34, which constitutes the bottom of the open groove P2, and the inner wall surfaces on both sides of the container 18 without a void. In this way, the diaphragm 20 can separate the region of the electrolysis chamber 16a including the PN junction cells 24a and 24b from the region of the electrolysis chamber 16b including the PN junction cell 24c, such that the permeation of gas does not occur while the permeation of ions occurs.

The diaphragm 20 is constituted with, for example, an ion exchange membrane, porous glass, or the like. The thickness of the diaphragm 20 is not particularly limited, but is preferably 20 μm to 500 μm.

The diaphragm 20 is attached to the open groove P2 between the PN junction cells 24b and 24c, but the present invention is not limited thereto. The diaphragm 20 may be attached to the open groove P2 between the PN junction cells 24a and 24b such that one PN junction cell 24a is included in the electrolysis chamber 16a, and two PN junction cells 24b and 24c are included in the electrolysis chamber 16b.

The gas production apparatus according to the first embodiment of the present invention is constituted as above, but the present invention is not limited thereto.

FIGS. 4A and 4B are a cross-sectional view and a top view respectively that schematically show an example of a gas production apparatus according to a second embodiment of the present invention.

As shown in the drawings, a gas production apparatus 50 has a PN junction module 52 in which a plurality of PN junctions composed of an inorganic semiconductor are electrically connected to each other in series, gas generation portions 14a and 54 which are disposed at open ends of the PN junctions positioned at both ends of the PN junction module 52, respectively, the container 18 constituting the electrolysis chamber 16 which contains the aqueous electrolytic solution AQ in contact with the two gas generation portions 14a and 54 and hydrogen gas and oxygen gas that are generated in the gas generation portions 14a and 54 respectively, and the diaphragm 20 which partitions the electrolysis chamber 16 into two electrolysis chamber regions 16a and 56 including the gas generation portions 14a and 54 respectively.

The gas production apparatus 50 shown in FIGS. 4A and 4B has the same constitution as that of the gas production apparatus 10 shown in FIGS. 1A and 1B, except that the order of PN junction, that is, the order of laminating the buffer layer 30 and the photoelectric conversion layer 28, of a PN junction cell 58 of the PN junction module 52 that is included in the electrolysis chamber region 56 is opposite to the order of PN junction of the PN junction cell 24c of the PN junction module 12 in the gas production apparatus 10 that is included in the electrolysis chamber 16b. Therefore, the same constituents are marked with the same characters so as not to repeat the description thereon. Hereinafter, the differences between the gas production apparatus 50 and the gas production apparatus 10 will be described.

The PN junction module 52 is an integrated structure having three PN junction cells 24a, 24b, and 58 on the support substrate 22.

In each of the PN junction cells 24a and 24b, the back surface electrode 26, the photoelectric conversion layer 28, the buffer layer 30, and the transparent electrode 32 are laminated on each other in this order from the support substrate 22. In contrast, in the rightmost PN junction cell 58, the back surface electrode 26, the buffer layer 30, the photoelectric conversion layer 28, and the transparent electrode 32 are laminated on each other in this order from the support substrate 22. Therefore, the buffer layer 30 and the photoelectric conversion layer 28 are laminated on each other in an inverse order.

In the PN junction module 52, the rightmost PN junction cell 58 and the midmost PN junction cell 24b included in the electrolysis chamber region 16a share one back surface electrode 26. Therefore, the shared back surface electrode 26 is not provided with the separation groove P1 which separates the back surface electrode of the midmost PN junction cell 24b from the back surface electrode of the rightmost PN junction cell 58.

The buffer layer 30 is laminated on the upper surface of the back surface electrode 26 of the PN junction cell 58, and the photoelectric conversion layer 28 is laminated on the upper surface of the buffer layer 30.

The photoelectric conversion layer 28 extends to the support substrate 22 on the right end side in the drawings so as to conceal and cover the right end of the back surface electrode 26 and the buffer layer 30.

The transparent electrode 32 is laminated on the upper surface of the photoelectric conversion layer 28. The transparent electrode 32 becomes the gas generation portion 54 (positive electrode for electrolysis) generating oxygen from water by a photolysis reaction, and the surface thereof functions as the gas generation surface.

In the rightmost PN junction cell 58, the promoter 36b for generating oxygen that is in the form of scattered islands is formed on the transparent electrode 32 functioning as the gas generation portion 54 generating oxygen.

Accordingly, as described above, the region of the PN junction cell 58 in an electrolysis chamber 56 functions as the gas generation portion 54 generating oxygen and constitutes the oxygen gas generation region. The transparent electrode 32 of the PN junction cell 58 functions as an electrode for generating oxygen, and the surface of the transparent electrode 32 of the PN junction cell 58 functions as the gas generation surface.

Consequently, the surface of the transparent electrode 32 of the PN junction cell 58 that becomes the gas generation surface can be positioned slightly below the surface of the aqueous electrolytic solution AQ in the electrolysis chamber 56, and accordingly, owing to the flow of the aqueous electrolytic solution AQ which is supplied from the supply port 38b and discharged from the discharge port 40b, the oxygen generated on the surface of the transparent electrode 32 does not stay on the surface of the transparent electrode 32, and the surface of the transparent electrode 32 can come into contact with the aqueous electrolytic solution AQ at all times. As a result, oxygen can be generated with excellent efficiency.

As in a gas generation portion 54a of a gas production apparatus 50a shown in FIG. 5, the transparent electrode 32 may not be formed in the rightmost PN junction cell 58 of a PN junction module 52a, and the oxygen generation promoter 36b in the form of scattered islands may be directly formed on the photoelectric conversion layer 28. In this case, the region (of the photoelectric conversion layer 28 and the buffer layer 30) of the rightmost PN junction cell 58 not having a transparent electrode functions as the gas generation portion 54a generating oxygen and constitutes an oxygen gas generation region. The photoelectric conversion layer 28 of the PN junction cell 58 functions as the electrode for generating oxygen, and the surface of the photoelectric conversion layer 28 functions as the gas generation surface. In this case, the same effect can be obtained.

Furthermore, as in the gas generation portion 14a shown in the drawing, the transparent electrode 32 may not be formed in the leftmost PN junction cell 24a of the PN junction module 52a, and the hydrogen generation promoter 36a in the form of scattered islands may be directly formed on the buffer layer 30. Because this constitution is the same as the example shown in FIG. 2, detailed description thereon will not be made.

The gas production apparatus according to the second embodiment of the present invention is constituted as above, but the present invention is not limited thereto.

Figure 6:
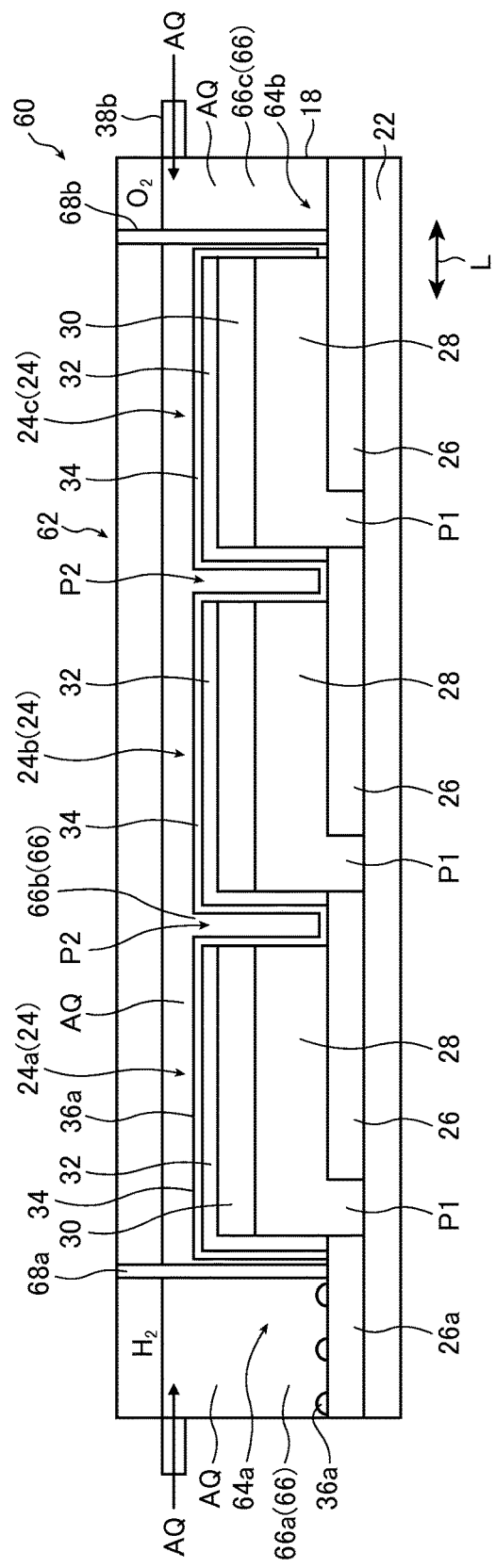
FIG. 6 is a cross-sectional view schematically showing an example of a gas production apparatus according to still another embodiment of the invention.

FIG. 6 is a cross-sectional view schematically showing an example of a gas production apparatus according to a third embodiment of the present invention.

As shown in the drawing, a gas production apparatus 60 has a PN junction module 62 in which a plurality of PN junctions composed of an inorganic semiconductor are electrically connected to each other in series, gas generation portions 64a and 64b which are disposed at open ends of the PN junctions positioned at both ends of the PN junction module 62, respectively, the container 18 constituting an electrolysis chamber 66 which contains the aqueous electrolytic solution AQ in contact with the two gas generation portions 64a and 64b and hydrogen gas and oxygen gas that are generated in the gas generation portions 64a and 64b respectively, and two diaphragms 68a and 68b which partition the electrolysis chamber 66 into three electrolysis chambers 66a, 66b, and 66c including the gas generation portion 64a, the PN junction module 62, and the gas generation portion 64b respectively.

The gas production apparatus 60 shown in FIG. 6 is different from the gas production apparatus 10a shown in FIGS. 2A and 2B, in terms of the constitution of the PN junction cell 24a of the PN junction module 62, the constitution of the gas generation portions 64a and 64b, the constitution of the electrolysis chambers 66a, 66b, and 66c, and the placement of the two diaphragms 68a and 68b. Except for these, the gas production apparatus 60 has the same constitution as that of the gas production apparatus 10. Therefore, the same constituents are marked with the same characters so as not to repeat the description thereon. Hereinafter, the differences between the gas production apparatus 60 and the gas production apparatus 10 will be described.

As is the case with the PN junction modules 12 and 12a shown in FIGS. 1 and 2, the PN junction module 62 is an integrated structure having the three PN junction cells 24a, 24b, and 24c on the support substrate 22.

Also in the leftmost PN junction cell 24a, as in the midmost PN junction cell 24b and the rightmost PN junction cell 24c, the back surface electrode 26, the photoelectric conversion layer 28, the buffer layer 30, the transparent electrode 32, and the transparent insulating film 34 are laminated on each other in this order from the support substrate 22.

As shown in the drawing, in the leftmost electrolysis chamber 66a of the container 18, a back surface electrode 26a is formed on the support substrate 22, and by the separation groove P1, the back surface electrode 26a is separated from the back surface electrode 26 of the leftmost PN junction cell 24a of the PN junction module 62. On the exposed upper surface of the back surface electrode 26a, the promoter 36a for generating hydrogen that is in the form of scattered islands is formed. The separation groove P1 of the PN junction cell 24a is filled with the photoelectric conversion layer 28.

The transparent electrode 32 of the leftmost PN junction cell 24a is continuously provided so as to cover the upper surface of the buffer layer 30 and the lateral faces on the electrolysis chamber 66a side of the photoelectric conversion layer 28 and the buffer layer 30 laminated on each other. The transparent electrode 32 is connected to the back surface electrode 26a extending in the electrolysis chamber 66a. In this way, due to the transparent electrode 32 of each of the PN junction cells 24a, 24b, and 24c, the three PN junction cells 24a, 24b, and 24c are connected to each other in series between the back surface electrode 26a and the back surface electrode 26 of the rightmost PN junction cell 24c.

In each of the three PN junction cells 24a, 24b, and 24c, the transparent insulating film 34 is continuously provided so as to cover the entire outer surface of the laminate of the back surface electrode 26, the photoelectric conversion layer 28, the buffer layer 30 and the transparent electrode 32 of the relevant PN junction cell, except for the back surface electrode 26a and the portion extending from the back surface electrode 26 of the PN junction cell 24c. Specifically, the transparent insulating film 34 is continuously provided so as to cover the exposed upper surfaces of the back surface electrodes 26 in the two open grooves P2, the upper surfaces of the transparent electrodes 32, and the lateral faces on both sides of the photoelectric conversion layer 28 and the buffer layer 30 laminated on each other.

In the drawing, on the left side of the leftmost PN junction cell 24a, the diaphragm 68a is attached onto the back surface electrode 26a in a state of coming into close contact with the back surface electrode 26 without a void. On the other hand, in the drawing, on the right side of the rightmost PN junction cell 24c, the diaphragm 68b is attached onto the portion extending from the back surface electrode 26 in a state of coming into close contact with the portion extending from the back surface electrode 26 without a void. Both of the diaphragms 68a and 68b are attached to the inner wall surfaces on both sides of the container 18 in a state of coming into close contact with the inner wall surfaces without a void.

The diaphragms 68a and 68b, which are membranes permeable to ions but impermeable to gas, as the diaphragm 20 shown in FIGS. 1 and 2, thus separate the electrolysis chamber 66 in the container 18 into the electrolysis chambers 66a, 66b, and 66c.

On the surface of the back surface electrode 26a extending inside the electrolysis chamber 66a, the hydrogen generation promoter 36a in the form of scattered islands is formed. The back surface electrode 26a functions as the electrode for generating hydrogen of the gas generation portion 64a generating hydrogen, and the surface of the back surface electrode 26a functions as the gas generation surface generating hydrogen by coming into contact with the aqueous electrolytic solution AQ retained in the electrolysis chamber 66a. Accordingly, the electrolysis chamber 66a functions as the gas generation portion 64a generating hydrogen and constitutes the hydrogen gas generation region.

The portion extending from the back surface electrode 26 of the PN junction cell 24c which extends inside the electrolysis chamber 66c functions as the electrode for generating oxygen of the gas generation portion 64b generating oxygen. The surface of the portion extending from the back surface electrode 26 functions as the gas generation surface generating oxygen by coming into contact with the aqueous electrolytic solution AQ retained in the electrolysis chamber 66c. Accordingly, the electrolysis chamber 66c functions as the gas generation portion 64b generating oxygen and constitutes an oxygen gas generation region.

The three PN junction cells 24a, 24b, and 24c of the PN junction module 62 are housed in the electrolysis chamber 66b.

When light is incident on the light receiving surface (transparent insulating film 34) of the three PN junction cells 24a, 24b, and 24c of the PN junction module 62 in the electrolysis chamber 66b, a photolysis reaction of water occurs on the surface of the back surface electrode 26a in contact with the aqueous electrolytic solution AQ in the electrolysis chamber 66a and, as a result, hydrogen is generated and hydroxide ions are also generated.

On the other hand, in the electrolysis chamber 66c, a photolysis reaction of water occurs on the surface of the portion extending from the back surface electrode 26 that is in contact with the aqueous electrolytic solution AQ. As a result, oxygen is generated and hydrogen ions are also generated.

The hydrogen generated in the electrolysis chamber 66a is collected by a collection port not shown in the drawing, and the hydroxide ions generated in the aqueous electrolytic solution AQ pass through the diaphragm 68a and migrate into the electrolysis chamber 66b. Furthermore, the oxygen generated in the electrolysis chamber 66c is collected by a collection port not shown in the drawing, and the hydrogen ions generated in the aqueous electrolytic solution AQ pass through the diaphragm 68b and migrate into the electrolysis chamber 66b. As a result, in the electrolysis chamber 66b, the hydrogen ions and the hydroxide ions cause a neutralization reaction and return to water.

Accordingly, the generation of hydrogen in the electrolysis chamber 66a and the generation of oxygen in the electrolysis chamber 66c can be performed with excellent efficiency.

Figure 7:
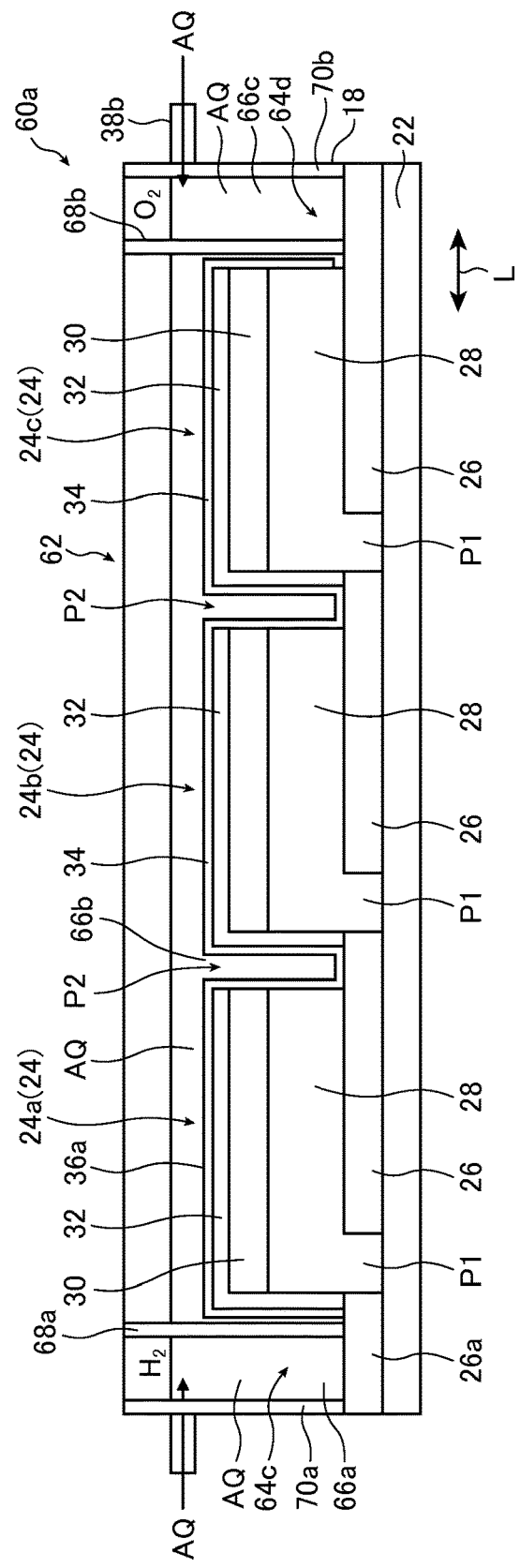
FIG. 7 is a cross-sectional view schematically showing another example of the gas production apparatus according to still another embodiment of the present invention.

As in a gas generation portion 64c in the electrolysis chamber 66a of a gas production apparatus 60a shown in FIG. 7, by providing the same conductive member 70a as the back surface electrode 26a in a position facing the diaphragm 68a in the electrolysis chamber 66a and connecting the conductive member 70a to the back surface electrode 26a so as to use the back surface electrode 26a and the conductive member 70a as electrodes for generating hydrogen and to make the surfaces of both the back surface electrode 26a and the conductive member 70a function as the gas generation surface generating hydrogen, the hydrogen generation efficiency can be improved. Therefore, the hydrogen generation promoter 36a may not be formed on the surface of the back surface electrode 26a.

Likewise, as in a gas generation portion 64d in the electrolysis chamber 66c, by providing the same conductive member 70b as the portion extending from the back surface electrode 26 of the PN junction cell 24c in a position facing the diaphragm 68b in the electrolysis chamber 66c and connecting the conductive member 70b to the portion extending from the back surface electrode 26 so as to use the portion extending from the back surface electrode 26 and the conductive member 70b as electrodes for generating oxygen and to make the surfaces of both the portion extending from the back surface electrode 26 and the conductive member 70b function as the gas generation surface generating oxygen, the oxygen generation efficiency can be improved.

The gas production apparatus according to the third embodiment of the present invention is constituted as above.

The gas production apparatus of the present invention has been specifically described, but the present invention is not limited to the examples described above. It goes without saying that the present invention can be improved or modified in various ways without departing from the gist and scope of the present invention.

For example, in the aforementioned examples, both of the gas generation portion for generating hydrogen and the gas generation portion for generating oxygen are provided on the side of the light receiving surface of the junction cell of the PN junction module, but the present invention is not limited thereto. One of the gas generation portion for generating hydrogen and the gas generation portion for generating oxygen may be provided on the side of the light receiving surface of the junction cell of the PN junction module.

EXAMPLES

Hereinafter, the gas production apparatus of the present invention will be specifically described based on the following Examples, to which the present invention is not limited.

Example 1

First, as Example 1, the gas production apparatus 10 shown in FIG. 1 in which the photoelectric conversion layers are formed of a CIGS film was prepared, the electrolysis chamber 16 was filled with an aqueous electrolytic solution, the apparatus was irradiated with light, and the amount of the generated hydrogen gas and oxygen gas was evaluated.

Figure 8:
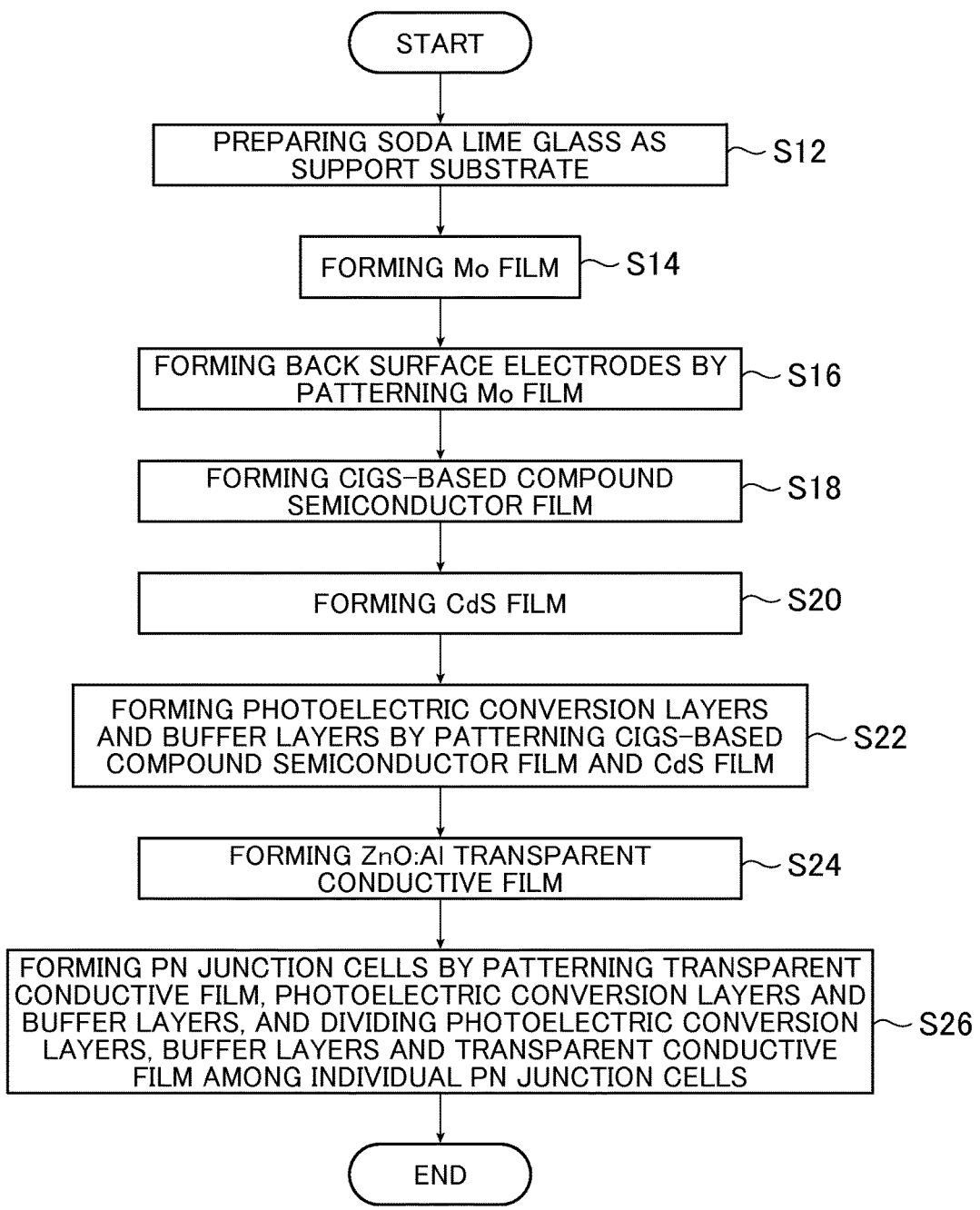
FIG. 8 is a flowchart showing an example of a process for manufacturing the gas production apparatus shown in FIG. 1.

The gas production apparatus of Example 1 was prepared according to the manufacturing flow shown in the flowchart of FIG. 8.

First, in Step S12, a soda lime glass substrate was prepared as the support substrate 22.

Thereafter, in Step S14, on the soda lime glass substrate, Mo was formed into a film having a thickness of about 200 nm by a sputtering method. Then, in Step S16, the Mo film was cut and patterned by laser scribing so as to form gaps serving as the separation grooves P1. In this way, as shown in FIG. 1A, the Mo back surface electrodes 26 were formed.

Subsequently, in Step S18, on the Mo back surface electrodes 26, a CIGS-based compound semiconductor film (CIGS film) as the photoelectric conversion layer 28 was formed so as to fill the gaps. In Example 1, as vapor deposition sources, granular raw materials of high-purity copper and indium (purity: 99.9999%), high-purity Ga (purity: 99.999%), and high-purity Se (purity: 99.999%) were used. As a substrate temperature monitor, a chromel-alumel thermocouple was used. After a main vacuum chamber was evacuated up to $10^{-6}$ Torr ($1.3 \times 10^{-3}$ Pa), a rate of vapor deposition from each of the vapor deposition sources was controlled, and under a film formation condition of a maximum substrate temperature of 530° C., a CIGS film having a thickness of about 1.8 μm was formed.

Thereafter, in step S20, a CdS thin film as the buffer layer 30 was deposited by a solution growth method to a thickness of about 90 nm. Then in Step S22, the CIGS-based compound semiconductor film and the CdS film formed on the Mo back surface electrodes 26 were integrally patterned by a mechanical scribing method so as to form the open grooves P2 reaching the back surface electrodes 26, thereby forming the photoelectric conversion layers 28 and the buffer layers 30.

After that, in step S24, on the buffer layers 30 formed as above, a ZnO:Al film as the transparent electrode 32, which was a transparent conductive film having a thickness of 0.6 μm, was formed by a DC sputtering method so as to fill the grooves.

Subsequently, in Step S26, the ZnO:Al film 32, the buffer layers 30, and the photoelectric conversion layers 28 formed as above were integrally cut by a mechanical scribing method so as to newly form smaller open grooves P2 reaching the back surface electrodes 26 between solar battery cells as the PN junction cells 24 adjacent to each other and thereby divide the photoelectric conversion layers 28, the buffer layers 30, and transparent electrode layers 32 among the individual solar battery cells (PN junction cells) 24. In this way, a plurality of solar battery cells 24 were formed.

Then, as shown in FIG. 1A, the portion outside the gas generation regions was covered with an insulating epoxy resin constituting the transparent insulating film 34.

Finally, the surface of the solar battery cell 24 that was not covered with the epoxy resin was dipped into an aqueous methanol solution containing chloroplatinic acid, and by a photodeposition method, a Pt promoter as the hydrogen generation promoter 36a was supported on the above surface. Meanwhile, the surface of the Mo back surface electrode 26 that was not covered with the epoxy resin was dipped into a colloidal $IrO_2$ solution obtained by hydrolysis of $Na_2IrCl_6$ for 30 minutes, and in this way, colloidal $IrO_2$ as the oxygen generation promoter 36b was supported on the surface of the Mo back surface electrode 26.

The solar battery cells 24 were separated by an ion exchange membrane (Nafion: manufactured by Sigma-Aldrich Co. LLC.) (the diaphragm 20), and the electrolysis chambers 16a and 16b formed were filled with an 0.1 M aqueous $Na_2SO_4$ solution adjusted to have a pH of 9.5, thereby preparing the gas production apparatus of Example 1 that was of a two-chamber cell type.

The two-chamber cell-type gas production apparatus of Example 1 prepared as above was irradiated with light, and the amount of generated gas was evaluated.

Example 2

Next, as Example 2, the gas production apparatus 10 shown in FIG. 1 in which the photoelectric conversion layers are formed of a CZTS film was prepared, the electrolysis chamber 16 was filled with an aqueous electrolytic solution, the apparatus was irradiated with light, and the amount of generated hydrogen gas and oxygen gas was evaluated.

The gas production apparatus of Example 2 was prepared in the same manner as in Example 1, except that the CIGS film constituting the photoelectric conversion layers was changed to a CZTS film.

First, until the Mo back surface electrodes 26 having gaps were formed on a soda lime glass substrate, the same steps as those in Example 1 were performed.

Thereafter, on the Mo back surface electrodes 26, a CZTS film as the photoelectric conversion layer 28 was formed so as to fill the gaps serving as the separation grooves P1. In Example 2, as vapor deposition sources, granular raw materials of high-purity copper and zinc (purity: 99.999%), high-purity In (purity: 99.999%), and high-purity Se (purity: 99.999%) were used. As a substrate temperature monitor, a chromel-alumel thermocouple was used. After a main vacuum chamber was evacuated up to $10^{-6}$ Torr ($1.3\times10^{-3}$ Pa), a rate of vapor deposition from each of the vapor deposition sources was controlled, and under a film formation condition of a maximum substrate temperature of 530° C., a CZTS film having a thickness of about 1.8 μm was formed.

Then, a CdS thin film as the buffer layer 30 was deposited by a solution growth method to a thickness of about 90 nm. The CZTS-based compound semiconductor film and the CdS film formed on the Mo back surface electrodes 26 were integrally patterned by a mechanical scribing method so as to form the grooves reaching the back surface electrodes 26, thereby forming the photoelectric conversion layers 28 and the buffer layers 30.

Subsequently, in the same manner as in Example 1, the gas production apparatus of Example 2 that was of a two-chamber cell type was prepared.

The two-chamber cell-type gas production apparatus of Example 2 prepared as above was irradiated with light in the same manner as in Example 1, and the amount of generated gas was evaluated.

Example 3

Next, as Example 3, the gas production apparatus 50 shown in FIG. 4 in which the photoelectric conversion layers are formed of a CIGS film was prepared, the electrolysis chamber 16 was filled with an aqueous electrolytic solution, the apparatus was irradiated with light, and the amount of generated hydrogen gas and oxygen gas was evaluated.

First, until the Mo back surface electrodes 26 having gaps were formed on a soda lime glass substrate, the same steps as those in Example 1 were performed.

Thereafter, as shown in FIG. 4A, the portion outside a certain region (region of the PN junction cell 58) was masked and a ZnO thin film as the buffer layer 30 was deposited by a sputtering method to a thickness of about 100 nm. On the Mo back surface electrodes 26, a CIGS film as the photoelectric conversion layer 28 was formed so as to fill the gaps as the separation grooves P1. Herein, the CIGS film was formed in the same manner as in Example 1.

Then, on the CIGS film, a CdS thin film as the buffer layer 30 was deposited by a solution growth method to a thickness of about 90 nm, and as shown in FIG. 4A, partially removed by wiping in the certain region (region of the PN junction cell 58).

Subsequently, in the same manner as in Example 1, solar cells as the three PN junction cells 24a, 24b, and 58 of the PN junction module 52 were formed.

Thereafter, as shown in FIG. 4A, the portion outside the gas generation regions was covered with an insulating epoxy resin constituting the transparent insulating film 34.

After that, in the same manner as in Example 1, the gas production apparatus of Example 3 that was of a two-chamber cell type was prepared.

The two-chamber cell-type gas production apparatus of Example 3 prepared as above was irradiated with light in the same manner as in Example 1, and the amount of generated gas was evaluated.

Comparative Example 1

Figure 9A:
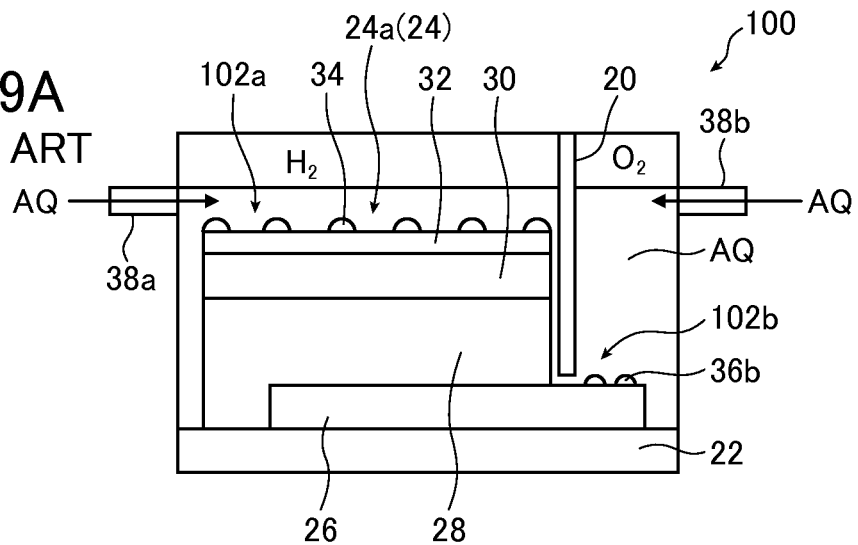
FIGS. 9A and 9B are a cross-sectional view and a top view respectively that schematically show a gas production apparatus of the prior art.
Figure 9B:
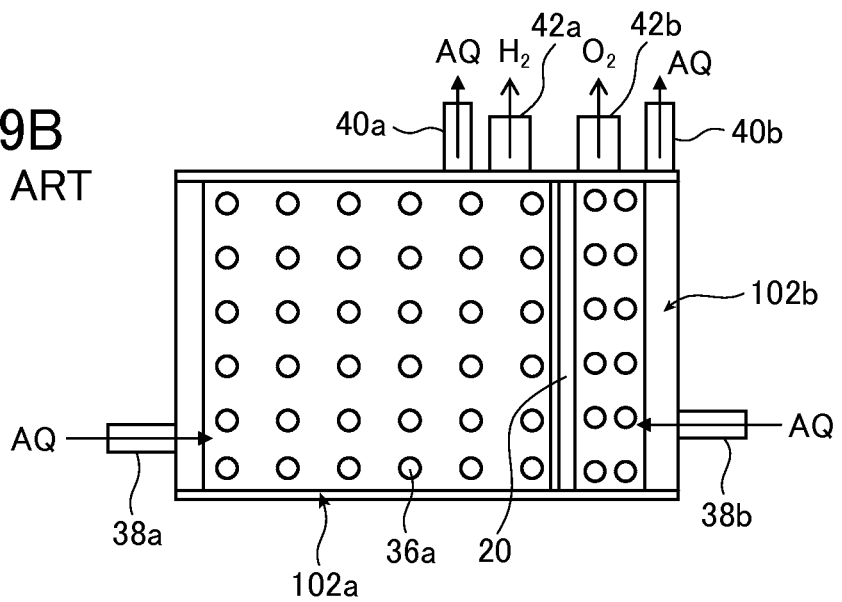

As Comparative Example 1, a gas production apparatus 100 of a two-chamber cell type as shown in FIG. 9 was prepared in the same manner as in Example 1, except that the gas production apparatus 100 had one PN junction, and an insulating resin was not used.

In the gas production apparatus 100 shown in the drawing, one PN junction cell 24a is disposed in an electrolysis chamber 102a separated by the diaphragm 20 and forms a hydrogen generation portion, while in another electrolysis chamber 102b, the back surface electrode 26 of the PN junction cell 24a is disposed in an elongated manner to form an oxygen generation portion.

The two-chamber cell-type gas production apparatus of Comparative Example 1 prepared as above was irradiated with light in the same manner as in Example 1, and the amount of generated gas was evaluated.

Comparative Example 2

Next, as Comparative Example 2, a gas production apparatus 200 shown in FIG. 10 in which the photoelectric conversion layers are formed of a CIGS film was prepared, the electrolysis chamber thereof was filled with an aqueous electrolytic solution, the apparatus was irradiated with light such that both hydrogen and oxygen are generated from the surfaces on the side opposite to the side where the light enters, and the amount of the generated hydrogen gas and oxygen gas was evaluated.

The back surface of the soda lime glass substrate 22 was masked in the pattern as shown, and Mo films 202a and 202b having a thickness of about 200 nm were formed. Thereafter, on the upper surface of the substrate 22, a Mo film 26 having a thickness of about 200 nm was formed by a sputtering method, and then a plurality of solar battery cells 24 (24a, 24b, and 24c) were prepared by the same process as in Example 1.

The electrodes 26 at both ends of the solar battery cells 24 and the Mo electrodes 202a and 202b on the lower surface of the substrate were electrically joined to each other by using a copper wire 204 and silver paste, and the exposed conductive portion on the upper surface of the substrate and the portion of the copper wire were covered with an epoxy resin 34.

Finally, the Mo electrode 202a on the lower surface of the solar battery cells that was not covered with the epoxy resin was dipped into an aqueous methanol solution containing chloroplatinic acid, and a Pt promoter 36a was supported on the Mo electrode 202a by a photodeposition method.

Furthermore, the surface of another Mo electrode 202b on the lower surface of the substrate was dipped into a colloidal $IrO_2$ solution obtained by hydrolysis of $Na_2IrCl_6$, and in this way, colloidal $IrO_2$ was supported on the surface of the Mo electrode 202b. The electrolysis chamber on the back surface side of the substrate 22 was partitioned by an ion exchange membrane 20 (Nafion) so as to form electrolysis chambers 206a and 206b, and the electrolysis chambers 206a and 206b were filled with a 0.1 M aqueous $Na_2SO_4$ solution adjusted to have a pH of 9.5, thereby preparing the gas production apparatus of Comparative Example 2 that was of a two-chamber cell type.

The two-chamber cell-type gas production apparatus of Comparative Example 2 prepared as above was irradiated with light, and the amount of generated gas was evaluated.

By using the aforementioned gas production apparatuses of Examples 1 to 3 and Comparative Examples 1 and 2, hydrogen and oxygen were generated, and the amount of gas generated by each of the apparatuses was evaluated as below.

As the amount of gas generated (initial stage), the amount of gas generated immediately after the start of light irradiation was measured.

As the amount of gas generated (after a passage of time), the amount of gas generated 10 hours after the start of light irradiation was measured.

The results are shown in Table 1.

In Table 1, the amount of generated hydrogen gas (initial stage) in Example 1 was assumed to be 100 and used as the standard.

TABLE 1

| | Amount of hydrogen gas (initial stage) | Amount of hydrogen gas (after a passage of time) |
| --- | --- | --- |
| Example 1 | 100 | 90 |
| Example 2 | 60 | 55 |
| Example 3 | 70 | 60 |
| Comp. Example 1 | 0 | 0 |
| Comp. Example 2 | 80 | 40 |

As shown in Table 1, in Example 1 of the present invention, a large amount of gas was generated immediately after the start of light irradiation, and the amount of gas generated could be maintained at a high level even after a passage of time. Therefore, it is understood that gas can be stably generated.

In Examples 2 and 3 of the present invention, although the amount of gas generated immediately after the start of light irradiation was smaller than that of Example 1, a reduction in the amount of gas generated was small even after a passage of time. Therefore, it is understood that gas can be stably generated.

In contrast, in Comparative Example 1, because the gas production apparatus had only one PN junction, a potential (electromotive force) necessary for decomposing water into hydrogen and oxygen was not obtained, and therefore gas was not generated.

In Comparative Example 2, although a potential (electromotive force) necessary for decomposing water into hydrogen and oxygen was obtained due to the three PN junctions, the generated gas stayed between the gas generation surface and the aqueous electrolytic solution. Accordingly, the contact area between the aqueous electrolytic solution and the gas generation surface was reduced, and thus the gas generation efficiency decreased. After 24 hours, the amount of staying gas increased compared to the initial stage, and therefore the amount of gas generated was further reduced.

The above results clearly show the effects of the present invention.

What is claimed is:

1. A gas production apparatus, comprising:
   a PN junction module including a plurality of PN junctions connected in series to one another, each being formed of an inorganic semiconductor and having a light receiving surface on one side and a back surface on another side;
   two gas generators adapted to generate hydrogen gas and oxygen gas, respectively, that are provided at an open end of a PN junction at one extremity of the PN junction module and an open end of a PN junction at another extremity of the PN junction module, respectively, on a side of the PN junction module where the light receiving surface is located;
   an electrolysis chamber adapted to contain an aqueous electrolytic solution in contact with the two gas generators and contain gases generated by the two gas generators; and
   a diaphragm which is ion-permeable but gas-impermeable, and partitions the electrolysis chamber into two regions including the two gas generators, respectively, wherein
   the PN junction module is connected in series by connecting the back surface of a PN junction to the light receiving surface of an adjacent PN junction by a conductive material,
   the two regions into which the electrolysis chamber is partitioned by the diaphragm are a region in which hydrogen generated by one of the two gas generators in contact with the aqueous electrolytic solution is contained and a region which contains oxygen generated by another of the two gas generators in contact with the aqueous electrolytic solution, with the hydrogen and the oxygen being generated when light is made incident on the light receiving surface in the PN junction module, N-side surfaces of the plurality of PN junctions each constitute the light receiving surface, P-side surfaces of the plurality of PN junctions each constitute the back surface, the gas production apparatus further comprises back surface electrodes provided on the P-side surfaces of the plurality of PN junctions, the gas production apparatus further comprises an inverse PN junction with reversed order of junction that is positioned on an extended portion of the back surface electrode provided on a P-side surface of the PN junction at the other extremity of the PN junction module, a P-side surface of the inverse PN junction constitutes the light receiving surface, an N-side surface of the inverse PN junction is brought into contact with the extended portion of the back surface electrode, and the P-side surface of the inverse PN junction serves as another of the two gas generators that generates oxygen.

2. The gas production apparatus according to claim 1, further comprising a light transmitting insulating material which covers a surface of the conductive material in the PN junction module except for the two gas generators.

3. The gas production apparatus according to claim 1, wherein the inorganic semiconductor includes a CIGS compound semiconductor.

4. The gas production apparatus according to claim 1, wherein the inorganic semiconductor includes a CZTS compound semiconductor.

5. The gas production apparatus according to claim 1, wherein the inorganic semiconductor has an absorption wavelength edge equal to or greater than 800 nm.

6. The gas production apparatus according to claim 1, wherein:

an N-side surface of the PN junction at the one extremity of the PN junction module serves as one of the two gas generators that generates hydrogen; and the gas production apparatus further comprises light transmitting conductive films made of a light transmitting conductive material that cover the N-side surfaces of the plurality of PN junctions of the PN junction module except for the PN junction at the one extremity, respectively.

7. The gas production apparatus according to claim 1, further comprising light transmitting conductive films made of a light transmitting conductive material that cover the N-side surfaces of the plurality of PN junctions, wherein a light transmitting conductive film which covers an N-side surface of the PN junction at the one extremity of the PN junction module serves as one of the two gas generators that generates hydrogen.

8. The gas production apparatus according to claim 1, further comprising light transmitting conductive films made of a light transmitting conductive material that cover the N-side surfaces of the plurality of PN junctions, wherein:

one of the two gas generators that generates hydrogen is electrically connected to a light transmitting conductive film which covers an N-side surface of the PN junction at the one extremity of the PN junction module; and the diaphragm is provided between one of the two gas generators that generates hydrogen and the PN junction at the one extremity.

9. The gas production apparatus according to claim 1, wherein a back surface electrode provided on a P-side surface of the PN junction at the other extremity of the PN junction module partially serves as another of the two gas generators that generates oxygen.

10. The gas production apparatus according to claim 1, wherein:

an extended portion of a back surface electrode provided on a P-side surface of the PN junction at the other extremity of the PN junction module serves as another of the two gas generators that generates oxygen; and the diaphragm is provided between another of the two gas generators that generates oxygen and the PN junction at the other extremity of the PN junction module.

11. The gas production apparatus according to claim 1, further comprising a promoter positioned on a surface of at least one of the two gas generators.

12. The gas production apparatus according to claim 11, wherein the promoter positioned on the surface of one of the two gas generators that generates hydrogen is platinum as a hydrogen generation catalyst.

13. The gas production apparatus according to claim 11, wherein the promoter positioned on the surface of another of the two gas generators that generates oxygen is metal, $CoO_x$ or $IrO_2$ as an oxygen generation catalyst.

14. The gas production apparatus according to claim 1, wherein the plurality of PN junctions are equal to one another in amount of electric current generated by light irradiation.

15. The gas production apparatus according to claim 1, wherein the plurality of PN junctions are equal to one another in light receiving area of the light receiving surface.

16. The gas production apparatus according to claim 1, further comprising a supply port for supplying the aqueous electrolytic solution into the electrolysis chamber and a discharge port for discharging the aqueous electrolytic solution in the electrolysis chamber, wherein the supply port and the discharge port are provided at the apparatus to generate a flow of the aqueous electrolytic solution.

17. The gas production apparatus according to claim 16, wherein:

N-side surfaces of the plurality of PN junctions each constitute the light receiving surface;

P-side surfaces of the plurality of PN junctions each constitute the back surface;

the gas production apparatus further comprises back surface electrodes provided on the P-side surfaces of the plurality of PN junctions, an extended portion of a back surface electrode provided on a P-side surface of the PN junction at the other extremity of the PN junction module serves as another of the two gas generators that generates oxygen; and the diaphragm is provided between another of the two gas generators that generates oxygen and the PN junction at the other extremity of the PN junction module.

18. A gas production apparatus, comprising:

a PN junction module including a plurality of PN junctions connected in series to one another, each being formed of an inorganic semiconductor and having a light receiving surface on one side and a back surface on another side;

two gas generators adapted to generate hydrogen gas and oxygen gas, respectively, that are provided at an open end of a PN junction at one extremity of the PN junction module and an open end of a PN junction at another extremity of the PN junction module, respectively, on a side of the PN junction module where the light receiving surface is located;

an electrolysis chamber adapted to contain an aqueous electrolytic solution in contact with the two gas generators and contain gases generated by the two gas generators; and a diaphragm which is ion-permeable but gas-impermeable, and partitions the electrolysis chamber into two regions including the two gas generators, respectively, wherein the PN junction module is connected in series by connecting the back surface of a PN junction to the light receiving surface of an adjacent PN junction by a conductive material, the two regions into which the electrolysis chamber is partitioned by the diaphragm are a region in which hydrogen generated by one of the two gas generators in contact with the aqueous electrolytic solution is contained and a region which contains oxygen generated by another of the two gas generators in contact with the aqueous electrolytic solution, with the hydrogen and the oxygen being generated when light is made incident on the light receiving surface in the PN junction module, N-side surfaces of the plurality of PN junctions each constitute the light receiving surface, P-side surfaces of the plurality of PN junctions each constitute the back surface, the gas production apparatus further comprises back surface electrodes provided on the P-side surfaces of the plurality of PN junctions, the gas production apparatus further comprises an inverse PN junction with reversed order of junction that is positioned on an extended portion of the back surface electrode provided on a P-side surface of the PN junction at the other extremity of the PN junction module, a P-side surface of the inverse PN junction constitutes the light receiving surface, an N-side surface of the inverse PN junction is brought into contact with the extended portion of the back surface electrode, the gas production apparatus further comprises a light transmitting conductive film made of a light transmitting conductive material that covers the P-side surface of the inverse PN junction as the light receiving surface, and the light transmitting conductive film which covers the P-side surface of the inverse PN junction serves as another of the two gas generators that generates oxygen.

* * * * *